(12) United States Patent
Gruber et al.

(10) Patent No.: US 12,107,557 B2
(45) Date of Patent: Oct. 1, 2024

(54) CONCEPT FOR A BUFFERED FLIPPED VOLTAGE FOLLOWER AND FOR A LOW DROPOUT VOLTAGE REGULATOR

(71) Applicant: INTEL CORPORATION, Santa Clara, CA (US)

(72) Inventors: Daniel Gruber, St. Andrä (AT); Michael Kalcher, Graz (AT)

(73) Assignee: MAXLINEAR ASIA SINGAPORE PRIVATE LIMITED, Singapore (SG)

( * ) Notice: Subject to any disclaimer, the term of this patent is extended or adjusted under 35 U.S.C. 154(b) by 495 days.

(21) Appl. No.: 17/426,065

(22) PCT Filed: Oct. 10, 2019

(86) PCT No.: PCT/US2019/055489
§ 371 (c)(1),
(2) Date: Jul. 27, 2021

(87) PCT Pub. No.: WO2020/112255
PCT Pub. Date: Jun. 4, 2020

(65) Prior Publication Data
US 2022/0103142 A1   Mar. 31, 2022

(30) Foreign Application Priority Data
Nov. 27, 2018 (DE) .................. 10 2018 129 910.9

(51) Int. Cl.
*H03F 1/22* (2006.01)
*G05F 1/575* (2006.01)
(Continued)

(52) U.S. Cl.
CPC ............. *H03F 3/505* (2013.01); *G05F 1/575* (2013.01); *G05F 1/618* (2013.01); *H03F 3/45636* (2013.01)

(58) Field of Classification Search
CPC ....................................................... H03F 1/22
(Continued)

(56) References Cited

U.S. PATENT DOCUMENTS

| | | | |
|---|---|---|---|
| 7,791,411 B2* | 9/2010 | Frohlich | H03F 1/342 330/311 |
| 8,022,772 B2* | 9/2011 | Cassia | H03F 3/211 330/311 |

(Continued)

FOREIGN PATENT DOCUMENTS

| CN | 101419479 A | 4/2009 |
|---|---|---|
| CN | 104679088 A | 6/2015 |

OTHER PUBLICATIONS

International Search Report and Written Opinion in PCT/US2019/055489 dated Feb. 11, 2020.
(Continued)

*Primary Examiner* — Henry Choe
(74) *Attorney, Agent, or Firm* — Buchalter; Jason W. Croft

(57) ABSTRACT

Examples relate to a buffered flipped voltage follower circuit arrangement, low dropout voltage regulators, a capacitive digital-to-analog converter, a transceiver for wireless communication, a mobile communication device, a base station transceiver, and to a method for forming a buffered flipped voltage follower circuit arrangement. The buffered flipped voltage follower circuit arrangement comprises a first transistor ($M_p$) comprising a first terminal, a second terminal and a gate terminal. The buffered flipped voltage follower circuit arrangement comprises a second transistor ($M_c$) comprising a first terminal, a second terminal and a gate terminal. The buffered flipped voltage follower circuit arrangement comprises a buffer circuit comprising an input terminal and an output terminal. The buffered flipped voltage follower circuit arrangement a feed-forward compensation circuit ($-g_{mf}$)
(Continued)

comprising an input terminal and an output terminal. The first terminal of the first transistor ($M_p$) is coupled to a supply voltage of the flipped voltage follower circuit. The second terminal of the first transistor ($M_p$) is coupled with the first terminal of the second transistor ($M_c$) and with an output voltage terminal of the buffered flipped voltage follower circuit arrangement. The second terminal of the second transistor (Mc) is coupled with the input terminal of the buffer circuit and with the output terminal of the feed-forward compensation circuit ($-g_{mf}$). The gate terminal of the first transistor (MP) is coupled with the output terminal of the buffer circuit and with the input terminal of the feed-forward compensation circuit ($-g_{mf}$).

22 Claims, 25 Drawing Sheets

(51) Int. Cl.
  *G05F 1/618* (2006.01)
  *H03F 3/45* (2006.01)
  *H03F 3/50* (2006.01)
(58) Field of Classification Search
  USPC .................................................. 330/311, 310
  See application file for complete search history.

(56) References Cited

U.S. PATENT DOCUMENTS

| | | | |
|---|---|---|---|
| 8,212,614 | B2 | 7/2012 | Luff |
| 8,514,015 | B2* | 8/2013 | Chen ..................... H03F 1/223 |
| | | | 330/311 |
| 8,779,860 | B2* | 7/2014 | Jeon ....................... H03F 1/223 |
| | | | 330/311 |
| 2002/0175761 | A1 | 11/2002 | Bach et al. |
| 2007/0229166 | A1* | 10/2007 | Shor ..................... G05F 3/262 |
| | | | 330/288 |
| 2008/0084196 | A1 | 4/2008 | Lacombe et al. |
| 2011/0304393 | A1 | 12/2011 | Luff |
| 2012/0049951 | A1 | 3/2012 | Venkataraman et al. |
| 2012/0098574 | A1 | 4/2012 | Morikawa |
| 2014/0176098 | A1 | 6/2014 | Fang et al. |
| 2017/0077883 | A1 | 3/2017 | Chang |

OTHER PUBLICATIONS

International Preliminary Report on Patentability for International Application No. PCT/US2019/055489, mailed Jun. 10, 2021, 8 Pages.
Office Action for Chinese Application No. 201980090327.3, dated Sep. 28, 2023, 16 Pages.

* cited by examiner

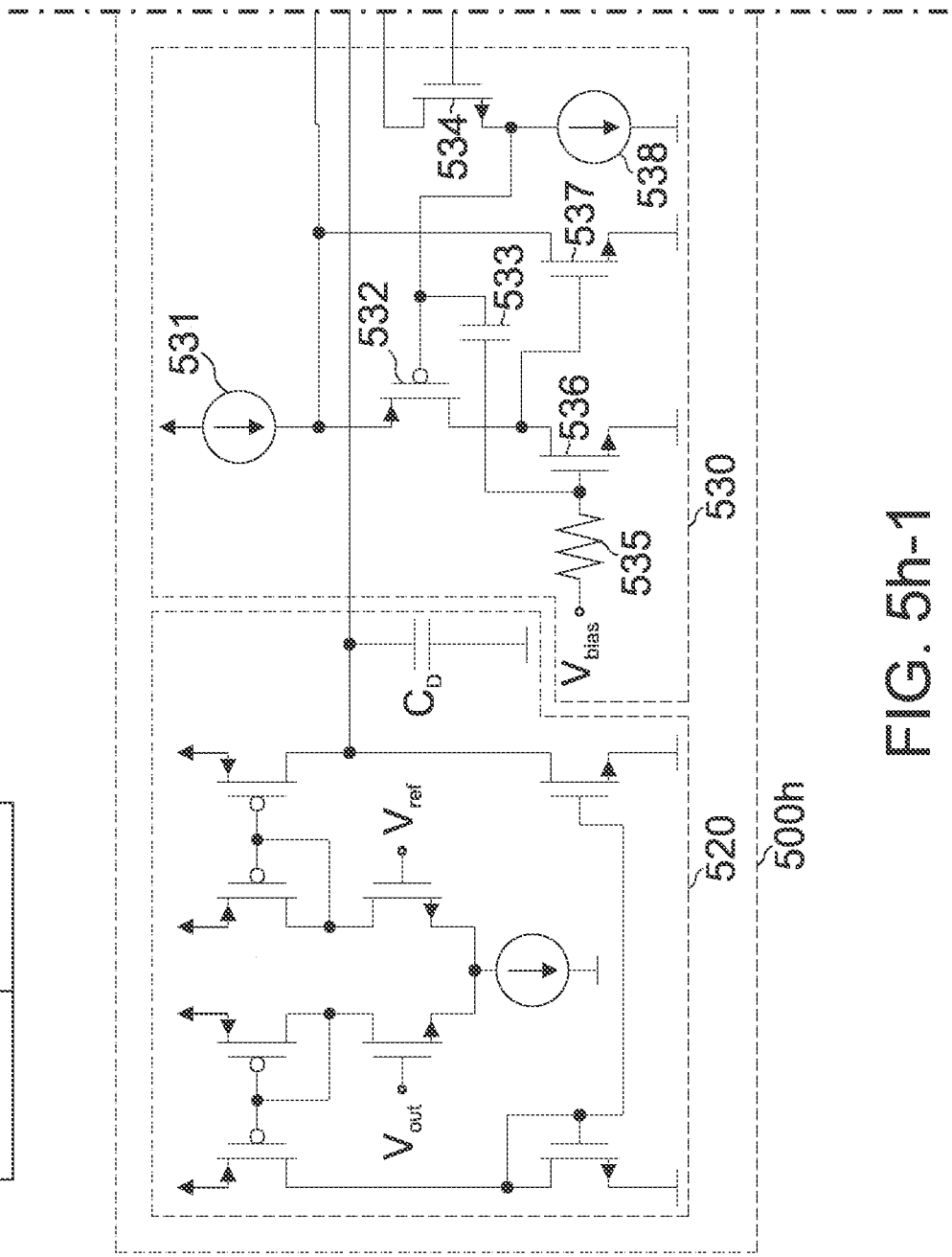

CONCEPT FOR A BUFFERED FLIPPED VOLTAGE FOLLOWER AND FOR A LOW DROPOUT VOLTAGE REGULATOR

FIELD

Examples relate to a buffered flipped voltage follower circuit arrangement, low dropout voltage regulators, a capacitive digital-to-analog converter, a transceiver for wireless communication, a mobile communication device, a base station transceiver, and to a method for forming a buffered flipped voltage follower circuit arrangement.

BACKGROUND

The transformation of previously purely analog circuit blocks, to either fully digital or digital-like circuit structures, offers many advantages such as reduced supply voltage, low silicon area, maximized benefits of technology scaling, and decreased power consumption, just to name a few. Contrary to digital circuits, within many such digital-like circuit implementations, the analog behavior (i.e. delay, rise/fall times etc.) of the digital circuit structures is of importance. Compared to purely analog implementations, digital-like architectures usually suffer from heavily reduced (or even vanished) power supply rejection compared to their purely analog predecessors. Therefore, many of the important analog properties become heavily dependent on the supply voltage, and (dynamic) variations thereof, contradicting the performance gains.

BRIEF DESCRIPTION OF THE FIGURES

Some examples of apparatuses and/or methods will be described in the following by way of example only, and with reference to the accompanying figures, in which.

DETAILED DESCRIPTION

Figure 1:
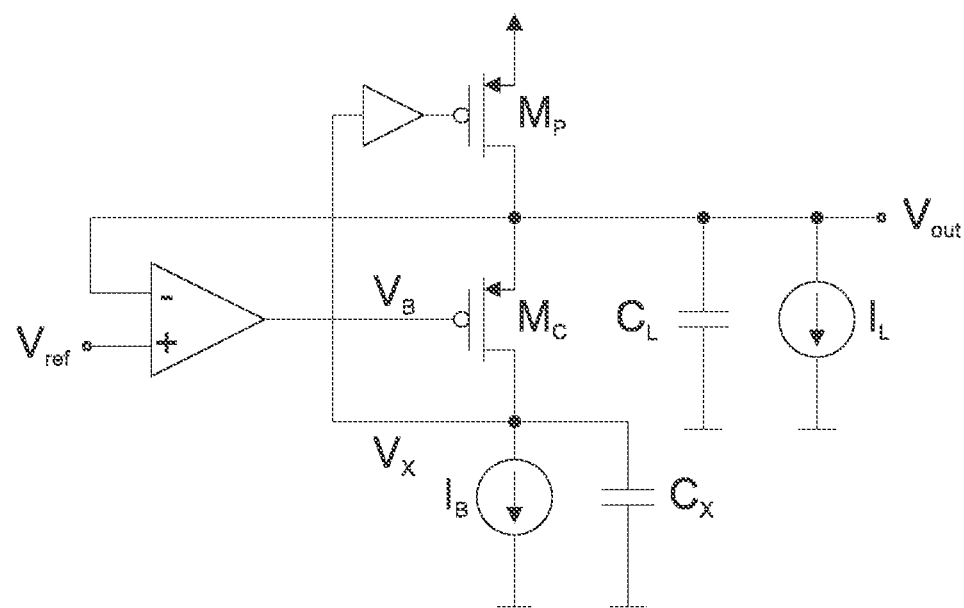
FIG. 1 shows a schematic diagram of a buffered flipped voltage follower circuit arrangement.

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Same or like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B, if not explicitly or implicitly defined otherwise. An alternative wording for the same combinations is "at least one of A and B" or "A and/or B". The same applies, mutatis mutandis, for combinations of more than two Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

At least some examples provide a feed-forward frequency compensation structure for buffered flipped voltage follower-based low dropout followers.

At least some examples relate to a low dropout voltage regulator (LDO) comprising a frequency compensation structure that allow for ultra-high regulation bandwidth at low power consumption.

Compared to purely analog implementations, digital-like architectures usually suffer from heavily reduced (or even vanished) power supply rejection compared to their purely analog predecessors. Thus, many circuits require a supply voltage regulator to provide the power supply rejection. Although several voltage regulator concepts are available, the LDO is a popular and most often proper choice. While there are many highly efficient LDO architectures and topologies available, many of them may feature only low regulation bandwidths in the range of maximum few MHz. This limitation may prove to be a serious issue for RF (Radio Frequency) circuitry with its ever increasing bandwidths and speeds, especially for capacitive RF digital-to-analog converters (CDAC), which are a prime example of a digital-like implementation. In such RF CDACs recent 4G ($4^{th}$ generation mobile communication systems) and WiFi (Wireless Fidelity) specifications may push some approaches beyond their limits. This issue will be even more severe with the upcoming 5G ($5^{th}$ generation mobile communication systems) communication standards.

The low regulation bandwidth may be countered with (very) large decoupling capacitors (nF to µF region) placed at the regulators output. This may provide for a low impedance at high frequencies. These capacitors are often external to the chip due to the required capacitance.

The introduction of (very) large external capacitors may increase cost in manifold ways: First, the component itself may be bought, area on the PCB (Printed Circuit Board) or package may be allocated close to the chip, and cost for assembly may increase. Second, an additional chip output may be required for each such capacitor, complicating the pin- or ball-out. Third, as external connections are introduced, extended ESD (Electro-Static Discharge) structures may be required for these nodes, further increasing silicon area and cost.

Additionally it might be unclear whether the introduction of an external capacitor can help decrease the output impedance of the regulator in the critical frequency regions. First, the capacitor itself may have a sufficiently high self-resonating frequency and second, due to all the (inductive) wiring parasitics in the package and on the PCB, additional resonances may be created potentially contradicting the effect of the capacitor altogether, potentially worsening the situation. Since this heavily depends on the layout and routing of the traces in question, the effect might not be known in advance, several design and measurement iterations might be necessary.

Alternatively, a high bandwidth LDO with a single supply voltage based on a (Buffered) Flipped Voltage Follower (FVF) may be used. FIG. 1 shows a Buffered Flipped Voltage Follower based LDO.

Such a structure is a dual-loop regulator: An inner high-frequency loop composed from the pass device $M_P$, the common-gate amplifier $M_C$, and, in case of the buffered version, $M_P$'s gate driver, and additionally an outer biasing loop setting the bias potential $V_B$ of the common gate amplifier defining the DC output voltage $V_{out}$. The inner fast loop may provide (moderate) gain at high frequencies, while the outer loop may have a (very) high gain at low frequencies providing for regulation accuracy. Such structures may achieve higher regulation bandwidths than conventional LDOs.

The FVF of FIG. 1 comprises the pass device transistor $M_P$, the common-gate amplifier transistor $M_C$, an operational amplifier for supplying the bias voltage $V_B$ and a buffer implementing the pass device's gate driver. Furthermore, the circuit schematic of FIG. 1 comprises two current sources $I_B$ (a biasing current source) and $I_L$ (current source for modeling the load current), two capacitances $C_L$ (in parallel to the load current source) and $C_X$ (in parallel to the biasing current source), and terminals for coupling the buffered FVF to the supply voltage and to ground, a reference voltage terminal $V_{ref}$ and an output voltage terminal $V_{out}$. In at least some examples, capacitance $C_L$ is implemented as a separate component, e.g. externally connected via a Printed Circuit Board or Package, or internally at the semiconductor device/chip. Capacitance $C_X$ models the parasitic capacitance at node $V_X$ that are caused by the layout of the FVF or of the LDO, e.g. intrinsic capacitances of the transistors or capacitances of the signal traces/interconnects. In some examples, capacitance $C_X$ may be implemented as a separate component. A first terminal (the source terminal) of the pass device $M_P$ is coupled to the supply voltage of the buffered FVF, the second terminal (the drain terminal) is coupled to output node/terminal $V_{out}$ and to the first terminal (the source terminal) of the common-gate amplifier transistor $M_C$. In the figures, node $V_{out}$ is further coupled to a first terminal of load capacitance $C_L$ and to a first terminal of current source $I_L$. Node $V_{out}$ is further coupled to an inverting input of the operational amplifier. The non-inverting input of the operational amplifier is coupled to the reference voltage terminal $V_{ref}$. The output of the operational amplifier (the bias voltage $V_B$) is coupled to the gate terminal of the common-gate amplifier transistor $M_C$. The second terminal (the drain terminal) of the common-gate amplifier transistor $M_C$ is denoted node $V_X$, which is coupled to an input of the buffer. In FIG. 1, node $V_X$ is further coupled to a first terminal of the current source $I_B$ and to a first terminal of capacitance $C_X$. The output of the buffer is coupled to an gate terminal of the pass device transistor $M_P$. The second terminals of input sources $I_B$ and $I_L$ and of capacitances $C_L$ and $C_X$ are coupled to a ground potential of the buffered FVF. In FIG. 1, the pass device transistor $M_P$ and the common-gate amplifier transistor $M_C$ are implemented as p-channel Metal Oxide Semiconductor Field Effect Transistors (MOSFET).

The (small signal) stability of such a circuit may be questionable and their performance, especially output impedance, might still be insufficient for CDAC applications. The Flipped Voltage Follower (FVF), shown in FIG. 1, may exhibit stability issues when used as a Low Dropout Regulator (LDO) with regulator bandwidths aimed well above 100 MHz.

Figure 2:
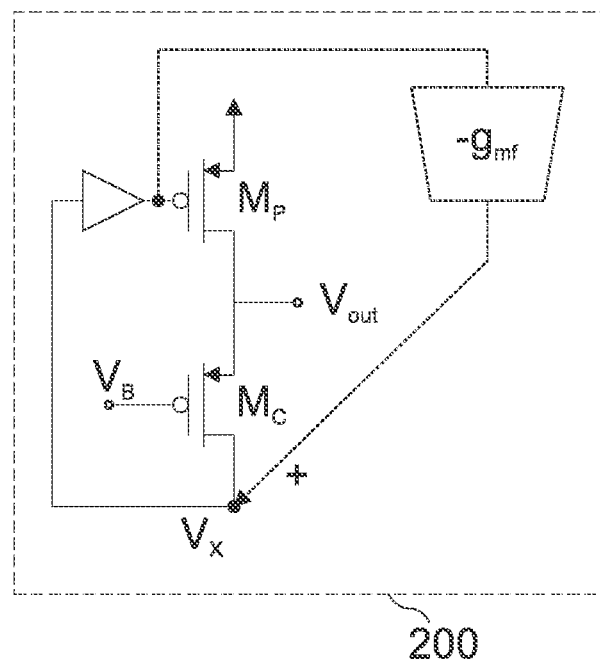
FIG. 2 shows a schematic diagram of a buffered flipped voltage follower circuit arrangement according to an example.
Figure 3A:
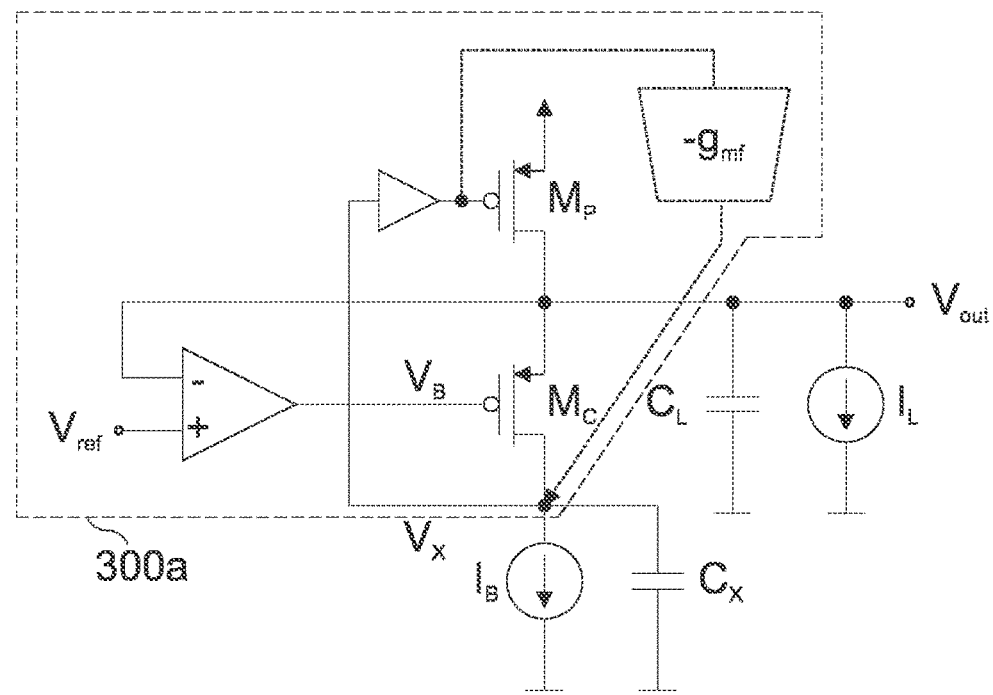
FIGS. 3a to 3c show schematic diagrams of buffered flipped voltage follower circuit arrangements according to examples.

Examples may introduce a feed-forward frequency compensation scheme, as shown in FIGS. 2 and 3a, enabling ultra-high regulator bandwidths and low output impedances with a simple and power efficient circuit structure that can readily be used for CDAC applications.

Examples may enable LDO regulators exhibiting ultra-high regulation bandwidths, low output impedances and robust stable behavior with a single input supply. The introduced feed forward compensation may increase power consumption negligibly while introducing a major benefit on the regulator's stability severely improving speed and efficiency.

The Flipped Voltage Follower (FVF), shown in FIG. 1, may exhibit stability issues when used as a Low Dropout Regulator (LDO) with regulator bandwidths aimed well above 100 MHz. To circumvent these stability issues, a feed-forward frequency compensation scheme, shown in 3a, is proposed. FIGS. 2 and 3a shows a buffered Flipped Voltage Follower with the proposed feed-forward compensation ($-g_{mf}$), e.g. an LDO with the buffered Flipped Voltage Follower with the proposed feed-forward compensation ($-g_{mf}$). In the following, the terms buffered flipped voltage follower, buffered flipped voltage follower circuit arrangement and low voltage dropout regulator comprising the buffered flipped voltage follower or buffered flipped voltage follower circuit arrangement may be used interchangeably.

FIGS. 2 and 3a show schematic diagrams of a buffered flipped voltage follower circuit arrangement 200/300a (e.g. the buffered Flipped Voltage Follower) according to examples. The buffered flipped voltage follower circuit arrangement comprises a first transistor $M_P$ (e.g. a pass transistor, pass device, or pass device transistor) comprising a first terminal, a second terminal and a gate terminal. The buffered flipped voltage follower circuit arrangement comprises a second transistor $M_C$ (e.g. a common gate amplifier or a common mode amplifier transistor) comprising a first terminal, a second terminal and a gate terminal. The buffered flipped voltage follower circuit arrangement comprises a buffer circuit comprising an input terminal and an output terminal. The buffered flipped voltage follower circuit arrangement comprises a feed-forward compensation circuit $-g_{mf}$ (e.g. a transconductance $-g_{mf}$ or a feed-forward compensation transconductance $-g_{mf}$) comprising an input terminal and an output terminal. For example, the feed-forward compensation circuit ($-g_{mf}$) may be a transconductance circuit. The first terminal of the first transistor $M_P$ is coupled to a supply voltage of the flipped voltage follower circuit. The second terminal of the first transistor $M_P$ is coupled with the first terminal of the second transistor $M_C$ and with an output voltage terminal of the buffered flipped voltage follower circuit arrangement. The second terminal of the second transistor $M_C$ is coupled with the input terminal of the buffer circuit and with the output terminal of the feed-forward compensation circuit $-g_{mf}$. The gate terminal of the first transistor $M_P$ is coupled with the output terminal of the buffer circuit and with the input terminal of the feed-forward compensation circuit $-g_{mf}$. The gate terminal of the second transistor $M_C$ may be coupled to a bias voltage $V_B$ of the buffered flipped voltage follower circuit arrangement, e.g. to the bias voltage $V_B$ provided by the operational amplifier. The second terminal of the second transistor $M_C$ may be coupled to a biasing current source $I_B$ of the buffered flipped voltage follower circuit arrangement.

By adding the feed-forward compensation circuit $-g_{mf}$ to the buffered FVF, a phase margin of the circuit may be increased, and thus a stability of the circuit at higher bandwidths may be improved.

The buffered FVF of FIGS. 2/3a may be implemented similar to the buffered FVF of FIG. 1. In addition, the buffered FVF comprises the feed-forward compensation transconductor circuit $-g_{mf}$. The input of the feed-forward compensation transconductor circuit $-g_{mf}$ is coupled to the gate terminal of the pass device transistor $M_P$ and the output of the feed-forward compensation transconductor circuit $g_{mf}$ is coupled to node $V_X$. The pass device transistor $M_P$ may correspond to the first transistor $M_P$ of examples, the common-gate amplifier transistor $M_C$ may correspond to the second transistor $M_C$ of examples, the buffer may correspond to the buffer circuit of examples and the feed-forward compensation circuit $-g_{mf}$ may correspond to the feed-forward compensation circuit $-g_{mf}$.

In examples, the first transistor/pass device transistor $M_P$ and the second transistor/common-gate amplifier transistor $M_C$ are implemented as a p-channel Metal Oxide Semiconductor Field Effect Transistors (p-MOSFET). According to further examples, however, the transistors described herein may be provided with complementary technology, e.g. as n-MOSFET instead of p-MOSFET. In some other examples, other types of transistors may be used. Thus, examples are not limited to p-channel (or n-channel) MOSFET transistors. In the example, in which the first transistor/pass device transistor $M_P$ and the second transistor/common-gate amplifier transistor $M_C$ are implemented as a p-channel Metal Oxide Semiconductor Field Effect Transistors (p-MOSFET), the first terminals may be source terminals, the second terminals may be drain terminals, and the gate terminals may be gate terminals of the respective transistors.

As is known to the person skilled in the art, transistors described herein may be composed of a plurality of (sub-) transistor structures connected in parallel. For example, the first transistor/pass device transistor $M_P$ and the second/common-gate amplifier transistor $M_C$ may each comprise a plurality of transistor structures that are connected in parallel and have common gate-, source-, and drain-terminals.

More details and aspects of the buffered flipped voltage follower (circuit arrangement) and/or of the LDO comprising the buffered flipped voltage follower (circuit arrangement) are mentioned in connection with the proposed concept or one or more examples described above or below (e.g. FIG. 1 to 9). The buffered flipped voltage follower (circuit arrangement) and/or of the LDO comprising the buffered flipped voltage follower (circuit arrangement) may comprise one or more additional optional features corresponding to one or more aspects of the proposed concept or one or more examples described above or below.

Figure 3B:
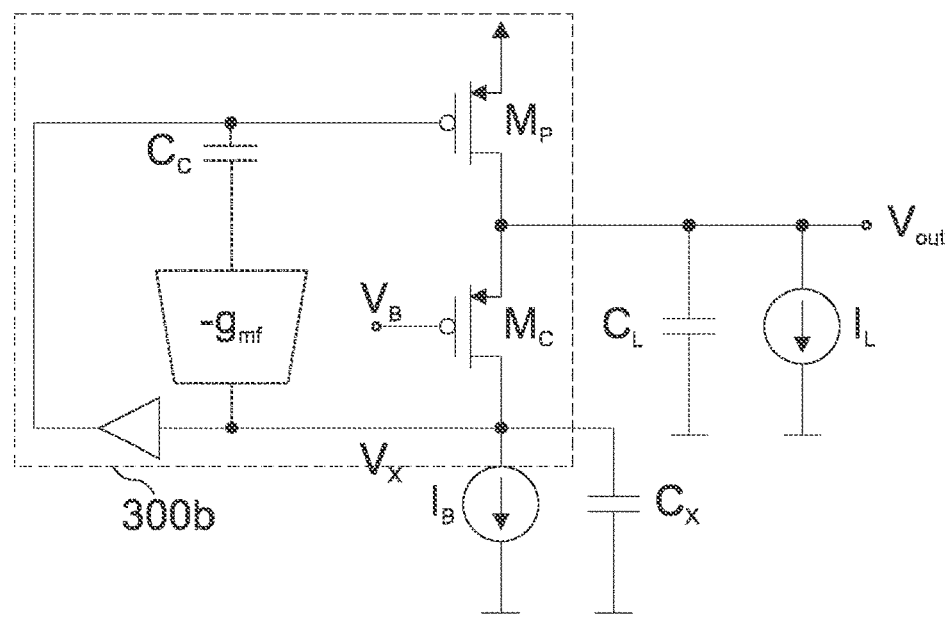
Figure 3C:
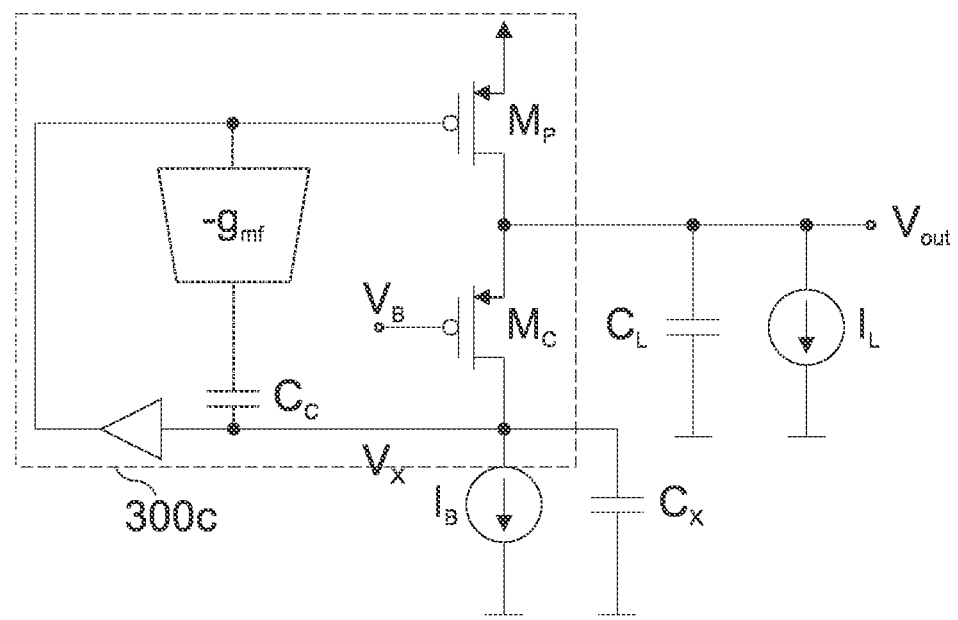

Shown in FIG. 3b and FIG. 3c are two possible architectures of the compensation scheme. For example, as shown in the subsequent figures, the feed-forward compensation circuit $-g_{mf}$ may comprise a coupling capacitor $C_C$. In the following, the term feed-forward compensation circuit may be used for the combination of the feed-forward compensation circuit and coupling capacitor, e.g. for the combination of transconductance $-g_{mf}$ and coupling capacitor $C_C$. The term "the input/output of the feed-forward compensation circuit $-g_{mf}$" may be understood as "the input/output of the feed-forward compensation circuit comprising transconductance $-g_{mf}$ and optionally comprising the coupling capacitor $C_C$". Alternatively, the feed-forward compensation circuit $-g_{mf}$ may be implemented without a coupling capacitor located at the input and/or output of the feed-forward compensation circuit $-g_{mf}$. In some examples, as e.g. shown in FIG. 3b, the feed-forward compensation circuit $-g_{mf}$ may be coupled with the gate terminal of the first transistor $M_P$ via the coupling capacitor $C_C$. FIG. 3b shows a buffered FVF 300b with feed-forward transconductance $-g_{mf}$ with coupling capacitor $C_C$ at the feed-forward transconductance's input. FIG. 3c shows a buffered FVF 300c with feed-forward transconductance $-g_{mf}$ with coupling capacitor $C_C$ at the feed-forward transconductance's input. In other words, the feed-forward compensation circuit $-g_{mf}$ may be coupled with the second terminal of the second transistor $M_C$ via the coupling capacitor $C_C$. The buffered FVFs are implemented similar to the buffered FVF of FIG. 3a. The feed-forward transconductance $g_{mf}$ may provide an additional signal path from the gate of the pass device to node $V_X$, bypassing the output node $F_{out}$. This creates additional zeros in the open loop transfer function and may therefore help stabilizing the circuit when designed for ultra-high regulation bandwidths exceeding 100 MHz. Note that the outer biasing loop is not shown in the following (from FIG. 3b), since, if correctly designed, it might not affect the inner loop in the frequency region of interest.

Figure 4A:
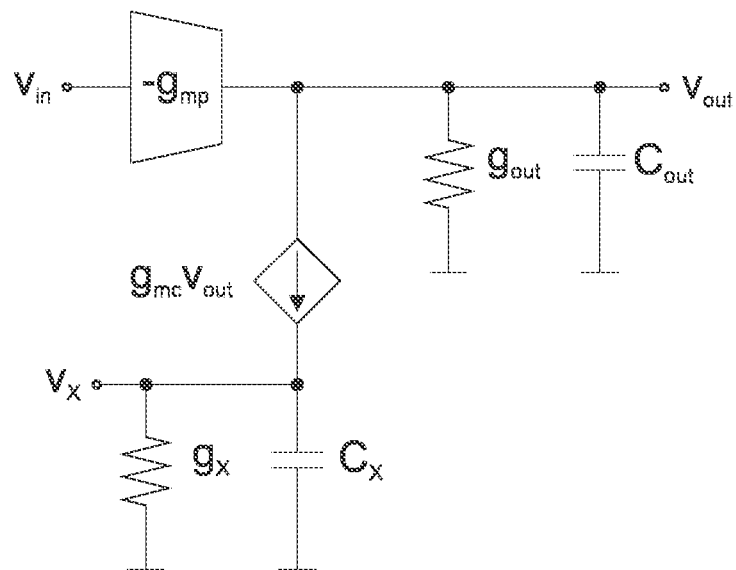
FIG. 4a shows an open loop transconductance model of a buffered flipped voltage follower circuit arrangement.
Figure 4B:
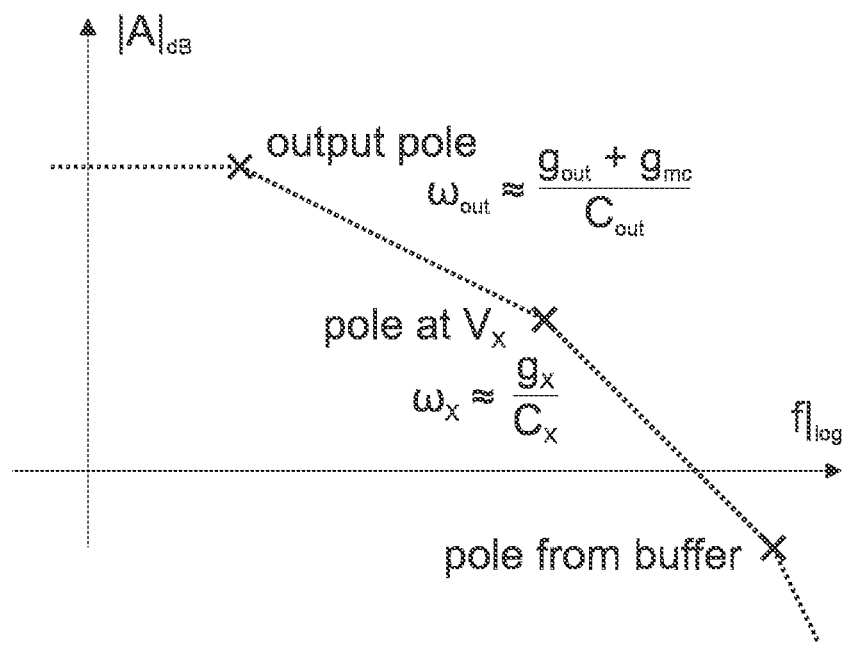
FIG. 4b shows a bode plot of an open loop transconductance model of a buffered flipped voltage follower circuit arrangement.

The simplified transconductance model of the (buffered) FVF is shown in FIG. 4a. FIG. 4a shows an open loop transconductance model of the (buffered) FVF, when the loop is broken at the gate of pass transistor $M_P$. In FIG. 4a, an input voltage terminal $v_{in}$ is coupled to an input of transconductance $-g_{mp}$. The output of the transconductance is coupled to an input of a voltage-controlled current source $g_{mc}v_{out}$, to first terminals of a model resistor $g_{out}$ and of a model capacitance $C_{out}$, and to the voltage output terminal $v_{out}$. The output of the voltage-controlled current source $g_{mc}v_{out}$ is coupled to node $v_X$ and to first terminals of model conductance $g_X$ at node $V_X$ and of capacitance $C_X$. The second terminals of the resistors and of the capacitances are coupled to ground potential. In FIG. 4a, the buffer is not shown. If it were included, it would be arranged between $v_{in}$ and $V_X$. In an open loop, the buffer would be coupled with $V_X$, and the output of the buffer might be of interest.

The resulting open loop transfer function is $$A_{OL}(s) = -\frac{g_{mp} \cdot g_{mc}}{g_X \cdot (g_{out} + g_{mc})} \frac{1}{\left(1 + s\frac{C_{out}}{g_{out} + g_{mc}}\right) \cdot \left(1 + s\frac{C_X}{g_X}\right)}$$

For the calculation, the frequency response of the buffer has been neglected. This is a valid approach if the voltage buffer's first pole is located at sufficiently high frequencies. The according bode plot is sketched in FIG. 4b. The y-axis shows the magnitude of the frequency response in decibels ($|A|_{dB}$) and the x-axis shows the (logarithmic) frequency. The frequency of the output pole is $$\omega_{out} \approx \frac{g_{out} + g_{mc}}{C_{out}}$$

and the frequency of the pole of $V_X$ is $$\omega_X \approx \frac{g_X}{C_X}.$$

The proposed compensation scheme may skip the pole associated with the output, effectively introducing a zero which may benefit speed and stability. If the pole introduced by the buffer is at sufficiently high frequencies, e.g. well above the unity gain frequency, it can be ignored in the analysis as assumed.

Figure 5A:
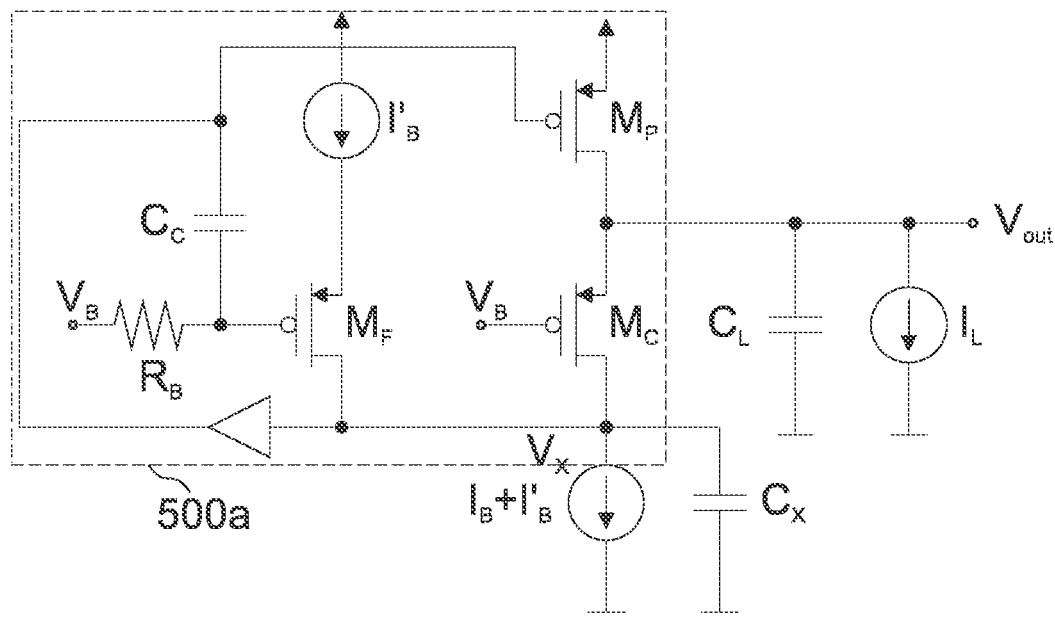
FIGS. 5a and 5b show schematic diagrams of examples of buffered flipped voltage follower circuit arrangements with a coupling capacitor at the input of a feed-forward compensation circuit of the buffered flipped voltage follower circuit arrangements.

The two variants of the proposed frequency compensation can be implemented differently. First, focus on the variant shown in FIG. 3b, where the coupling capacitor $C_C$ is located at the feed forward transconductance's input. Possible circuit implementations are shown in FIG. 5a (buffered FVF 500a) and FIG. 5b (buffered FVF 500b). In FIG. 5a, a dedicated branch is used for the transconductance $g_{mf}$. In FIG. 5a, the transconductance $g_{mf}$ is implemented by a transistor $M_F$, a current source $I'_B$, a resistor $R_B$ and a coupling capacitor $C_C$. The first terminal (the source terminal) of the transistor (e.g. as p-channel MOSFET as shown) is coupled with the current source $I'_B$ and the second terminal (the drain terminal) of the transistor $M_F$ is coupled to node $V_X$, e.g. the second terminal of common-gate amplifier transistor $M_C$. The second terminal of the transistor $M_F$ is the output terminal of the transconductance $g_{mf}$. The gate terminal of the transistor $M_F$ is coupled to the first terminal of the resistor $R_B$ and to the first terminal of the coupling capacitor $C_C$. The second terminal of the coupling capacitor is the input terminal of the feed-forward compensation circuit comprising the transconductance $-g_{mf}$ and the coupling capacitor and is coupled to the gate terminal of pass device transistor $M_P$. The second terminal of resistor $R_B$ is coupled to a bias voltage, e.g. to the bias voltage output by the operational amplifier, or any other bias voltage.

Figure 5B:
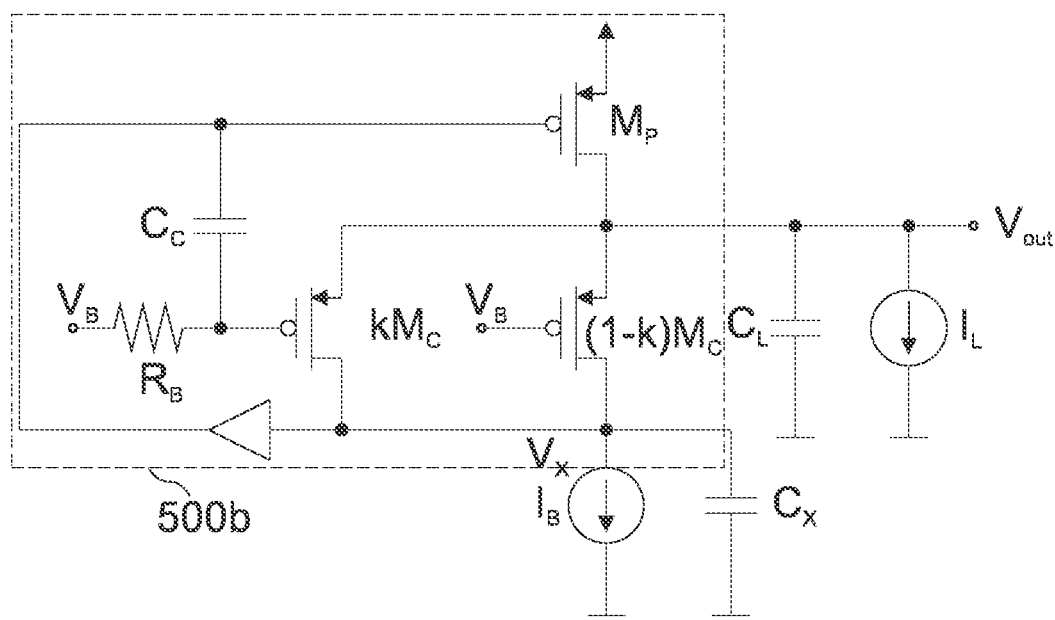

In other words, as shown in FIGS. 5a and 5b, the feed-forward compensation circuit $-g_{mf}$ may comprise a transistor $M_F$ and a resistor $R_B$. A gate terminal of the transistor $M_F$ may be coupled with a first terminal of the coupling capacitor $C_C$ and a first terminal of the resistor $R_B$. A second terminal of the resistor ($R_B$) may be coupled to a bias voltage of the buffered flipped voltage follower circuit arrangement. A second terminal of the coupling capacitor $C_C$ may be the input terminal of the feed-forward compensation circuit A first terminal of the transistor $M_F$ may be the output terminal of the feed-forward compensation circuit $-g_{mf}$. A second terminal of the transistor $M_F$ may be coupled with a current source $I'_B$ of the buffered flipped voltage follower circuit arrangement. In some examples, the bias voltage of the buffered flipped voltage follower circuit arrangement coupled to the second terminal of the resistor is the bias voltage of the buffered flipped voltage follower circuit arrangement coupled to a gate terminal of the second transistor $M_C$. This may enable a re-use of the bias voltage. Alternatively, the bias voltage of the buffered flipped voltage follower circuit arrangement coupled to the second terminal of the resistor may be different from a bias voltage of the buffered flipped voltage follower circuit arrangement coupled to a gate terminal of the second transistor $M_C$. This may enable improving the operating point of transistor $M_F$ independently from the operating point of transistor $M_C$.

Shown in FIG. 5b is a current re-use architecture, where the transconductance $g_{mf}$ is created by reusing a fraction k≤1 of the transistor $M_C$, providing a power efficient solution. (Values for k>1 are also possible, but need to be implemented differently with respect to the shown current re-use structure). In FIG. 5b, the transconductance $g_{mf}$ is implemented by a transistor $kM_C$, which re-uses a fraction of the common-gate amplifier transistor $M_C$, a resistor $R_B$ and a coupling capacitor $C_C$. The first terminal (the source terminal) of the transistor $kM_C$ (e.g. implemented as p-channel MOSFET as shown) is coupled with the first terminal of the common-gate amplifier transistor $M_C$, which is denoted $(1-k)M_C$ in FIG. 5b. The two transistors $kM_C$ and $(1-k)M_C$ may form the common-gate amplifier transistor $M_C$. The transistor $kM_C$ of the feed-forward compensation circuit $-g_{mf}$ may share a semiconductor structure with the second transistor $(1-k)M_C$. The term "sharing a semiconductor structure" may correspond to two transistors sharing fingers and/or gates of a common semiconductor structure. In this example, transistor $kM_C$ may use one or more transistor fingers and/or one or more gate structures of the second transistor $M_C$.

In the example of FIG. 5b, the second terminal (the drain terminal) of the transistor $kM_C$ is coupled to node $V_X$, e.g. the second terminal of transistor $(1-k)M_C$. In other words, in contrast to the example of FIG. 5a, if transistor $kM_C$ corresponds to $M_F$ of FIG. 5a, the first terminal of the transistor $M_F$ is coupled with the second terminal of the first transistor $M_P$ and the first terminal of the second transistor $M_C$. This may enable re-using a semiconductor structure of second transistor $M_C$ for transistor $M_F$, and may enable foregoing current source $I'_B$. In the example of FIG. 5b, the second terminal of the transistor $kM_C$ is the output terminal of the transconductance $-g_{mf}$. The gate terminal of the transistor $M_F$ is coupled to the first terminal of the resistor $R_B$ and to the first terminal of the coupling capacitor $C_C$. The second terminal of the coupling capacitor is the input terminal of the feed-forward compensation circuit comprising the transconductance $-g_{mf}$ and the coupling capacitor $C_C$ and is coupled to the gate terminal of pass device transistor $M_P$. The second terminal of resistor $R_B$ is coupled to the bias voltage, e.g. the bias voltage $V_B$ output by the operational amplifier.

Figure 5C:
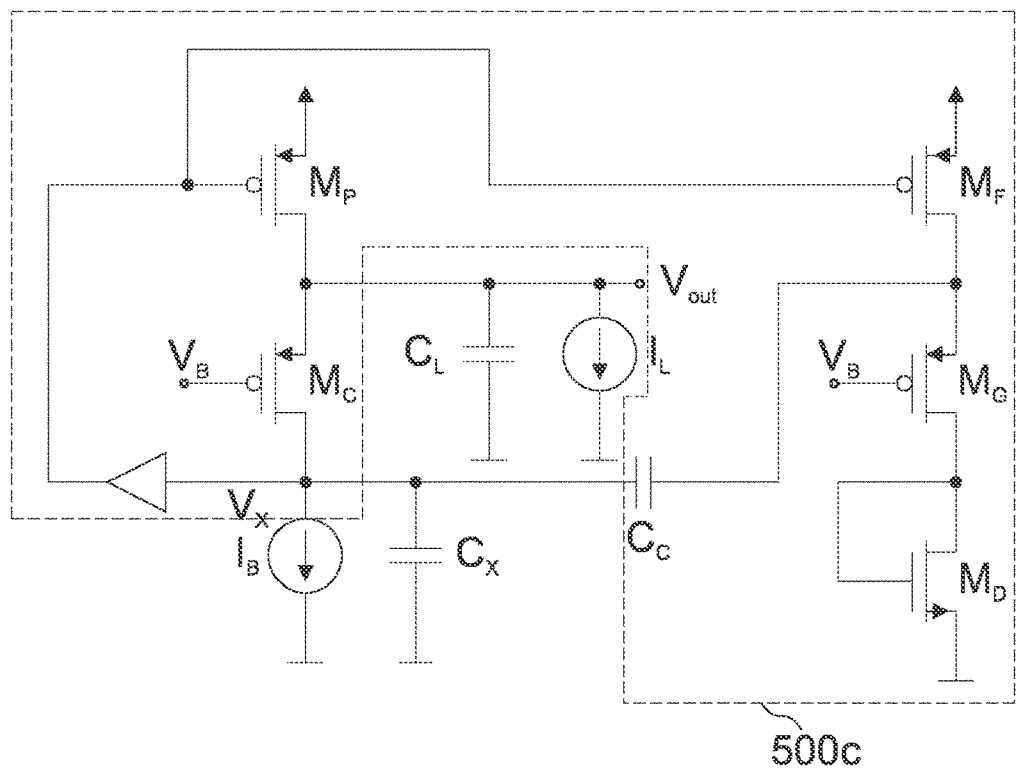
FIGS. 5c and 5d show schematic diagrams of examples of buffered flipped voltage follower circuit arrangements with a coupling capacitor at the output of a feed-forward compensation circuit of the buffered flipped voltage follower circuit arrangements.
Figure 5D:
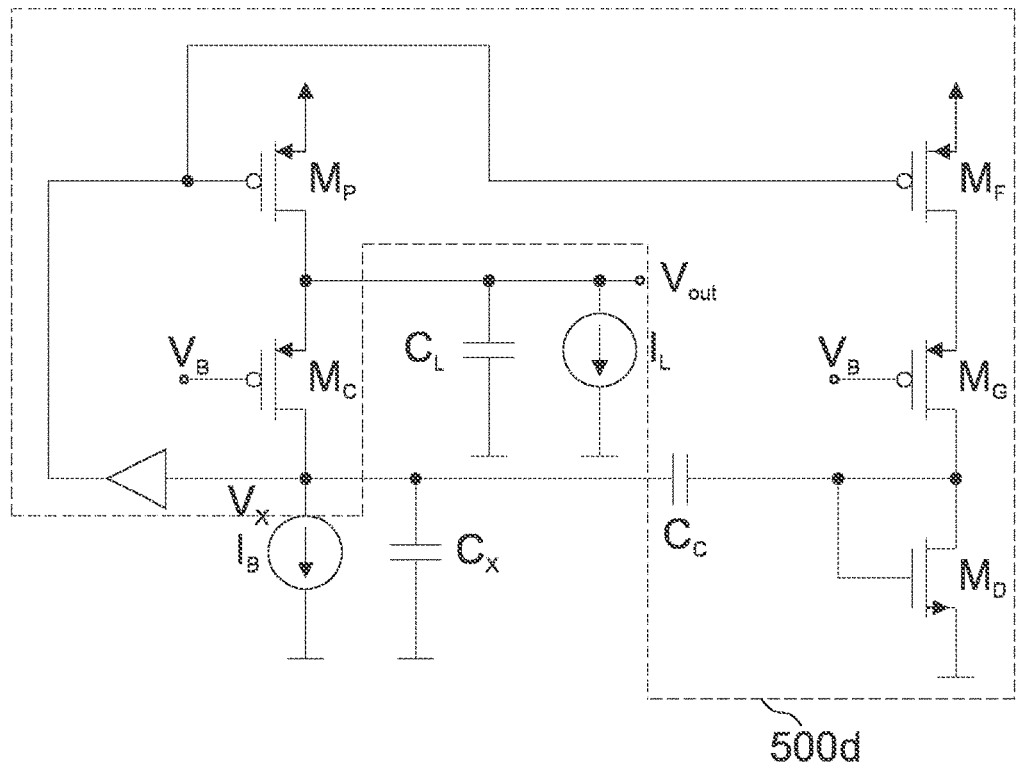
Figure 5E:
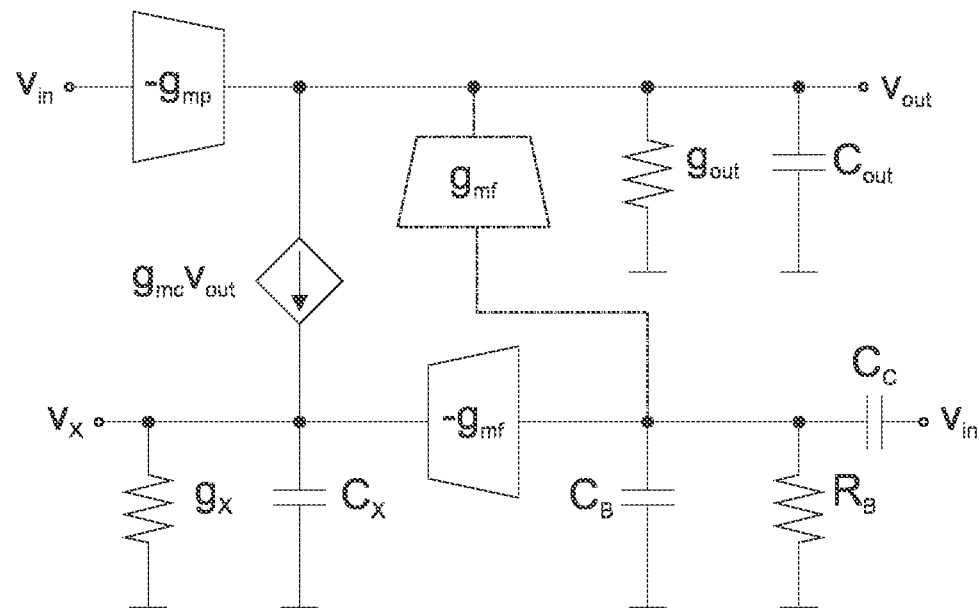
FIGS. 5e and 5f show open loop transconductance models of examples of buffered flipped voltage follower circuit arrangements.

The resulting open loop transconductance model, also incorporating the bias resistor $R_B$, is shown in FIG. 5e. In FIG. 5e, in addition to the open loop transconductance model of FIG. 4a, the transconductance $-g_{mf}$ is shown. An output of the transconductance $-g_{mf}$ is coupled to the first terminals of the model resistor $g_X$ and of the capacitance $C_X$. The input of the transconductance $-g_{mf}$ is coupled to first terminals of capacitance $C_B$, of resistor $R_B$ and of coupling capacitor $C_C$. The second terminal of coupling capacitor $C_C$ is coupled to the input voltage $v_{in}$, the second terminals of resistor $R_B$ and of capacitance $C_B$ are coupled to the ground potential. FIG. 5e further comprises the transconductance $g_{mf}$. The output terminal of the transconductance $g_{mf}$ is coupled to output terminal $v_{out}$, and the input terminal of transconductance $g_{mf}$ is coupled to the input terminal of transconductance $-g_{mf}$. The respective simplified open-loop transfer function for the implementation with the dedicated branch, shown in FIG. 5a, omitting the transconductance $g_{mf}$ shown with dashed lines in FIG. 5e, is $$A_{OL}(s) = -\frac{g_{mp} \cdot g_{mc}}{g_X \cdot (g_{out} + g_{mc})}$$

$$\frac{1 + sR_B\left(C_B + C_C + C_C\frac{g_{mf}(g_{out} + g_{mc})}{g_{mp} \cdot g_{mc}}\right) + s^2 R_B \frac{g_{mf} \cdot C_C \cdot C_{out}}{g_{mp} \cdot g_{mc}}}{\left(1 + s\frac{C_{out}}{g_{out} + g_{mc}}\right) \cdot \left(1 + s\frac{C_X}{g_X}\right) \cdot (1 + sR_B[C_B + C_C])}$$

The respective simplified open-loop transfer function of the current re-use architecture, shown in FIG. 5b, with $g_{mf} = k \cdot g_{mc}$, including the transconductance shown with dashed lines in FIG. 5e, is $$A_{OL}(s) =$$

$$-\frac{g_{mp} \cdot g_{mc}}{g_X \cdot (g_{out} + g_{mc})} \frac{1 + sR_B\left(C_B + C_C + C_C\frac{g_{mf} \cdot g_{out}}{g_{mp} \cdot g_{mc}}\right) + s^2 R_B \frac{g_{mf} \cdot C_C \cdot C_{out}}{g_{mp} \cdot g_{mc}}}{\left(1 + s\frac{C_{out}}{g_{out} + g_{mc}}\right) \cdot \left(1 + s\frac{C_X}{g_X}\right) \cdot (1 + sR_B[C_B + C_C])}$$

Compared to the open loop transfer function of the uncompensated FVF shown above, an additional pole (upper corner frequency of the introduced compensation path) and two zeros are introduced. The zeros' frequencies can be modified by choosing the size of the coupling capacitor $C_C$ and the "strength" of the compensation, the feed-forward compensation transconductance $g_{mf}$. This compensation scheme may already be sufficient to achieve a stable system with a high regulation bandwidth.

More details and aspects of the buffered flipped voltage follower (circuit arrangement) and/or of the LDO comprising the buffered flipped voltage follower (circuit arrangement) are mentioned in connection with the proposed concept or one or more examples described above or below (e.g. FIG. 1 to 9). The buffered flipped voltage follower (circuit arrangement) and/or of the LDO comprising the buffered flipped voltage follower (circuit arrangement) may comprise one or more additional optional features corresponding to one or more aspects of the proposed concept or one or more examples described above or below.

In the following, a second feed-forward compensation scheme, as shown in FIG. 3c, is introduced in more detail. Exemplary implementations (replica pass device) of the second feed-forward compensation scheme are shown in FIGS. 5c and 5d. In the buffered FVFs of FIG. 5c (500c) and 5d (500d), the transconductance $-g_{mf}$ is implemented using the three transistors $M_F$, $M_C$ and $M_D$. The feed-forward compensation circuit $-g_{mf}$ may comprise a third transistor $M_F$, an optional fourth transistor $M_G$ and a fifth transistor $M_D$. The third, fourth and fifth transistors may each comprise a first terminal, a second terminal and a gate terminal. The first terminal of the third transistor $M_F$ may be coupled to a supply voltage of the buffered flipped voltage follower circuit arrangement. The gate terminal of the third transistor $M_F$ may be the input terminal of the feed-forward compensation circuit $-g_{mf}$. In general, the second terminal of the third transistor $M_F$ may be coupled directly or indirectly with the first terminal of the fifth transistor $M_D$. In FIGS. 5c and 5d, the second terminal of the third transistor $M_F$ is coupled indirectly with the first terminal of the fifth transistor $M_D$ via the optional fourth transistor $M_G$. Consequently, the second terminal of the third transistor $M_F$ may be coupled with the first terminal of the fourth transistor $M_G$. The gate terminal of the fourth transistor $M_G$ may be coupled to a bias voltage of the buffered flipped voltage follower circuit arrangement, e.g. $V_B$. The second terminal of the fourth transistor $M_G$ may be coupled with the first terminal of the fifth transistor $M_D$. The second terminal of the fifth transistor $M_D$ may be coupled to a ground potential of the buffered flipped voltage follower circuit arrangement. In some examples, as shown in FIG. 5c, the first terminal of the coupling capacitor $C_C$ is the output terminal of the feed-forward compensation circuit and the second terminal of the coupling capacitor $C_C$ is coupled with the second terminal of the third transistor $M_F$ and with the first terminal of the fourth transistor $M_G$. Alternatively, as shown in FIG. 5d, the first terminal of the coupling capacitor $C_C$ may be the output terminal of the feed-forward compensation circuit and the second terminal of the coupling capacitor $C_C$ may be coupled with the second terminal of the fourth transistor $M_G$, and with the first terminal of the fifth transistor $M_D$. In FIGS. 5c and 5d, the gate of transistor $M_D$ is coupled to the second terminal of the transistor $M_G$. Alternatively, the gate of transistor $M_D$ may be coupled to a bias voltage, e.g. $V_B$. The implementations use a sensing device/replica transistor $M_F$, which may be composed from few fingers of the pass device $M_P$. In other words, the third transistor $M_F$ may share a semiconductor structure with the first transistor $M_P$. This may enable a smaller semiconductor footprint of the buffered FVF. In the following, the analysis is done for the variant shown in FIG. 5c, but is very similar for the circuit shown in FIG. 5d.

Figure 5F:
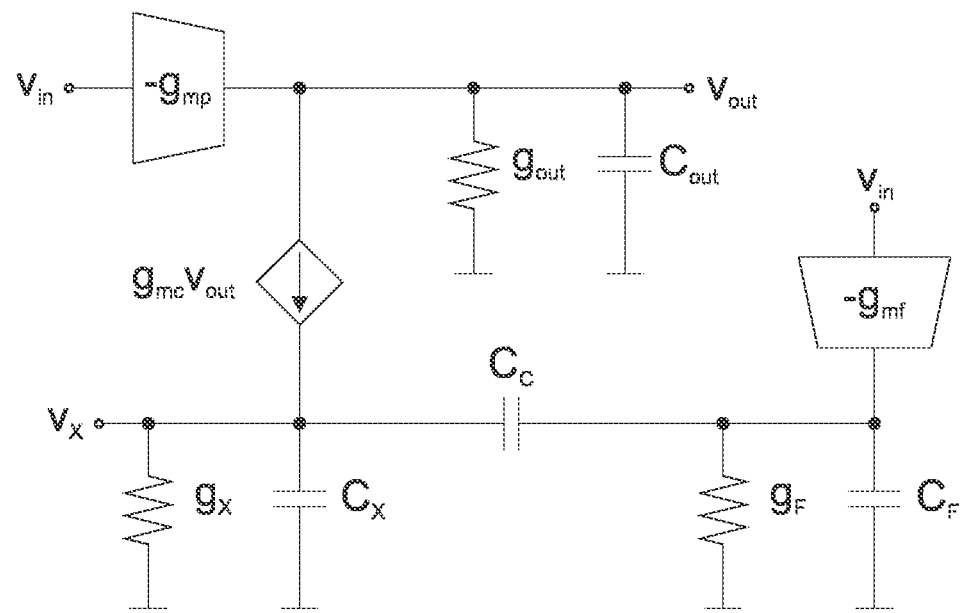

The open-loop transconductance model is shown in FIG. 5f. In addition to the open-loop transconductance model shown in FIG. 4a, the model of FIG. 5f further comprises the coupling capacitor $C_C$, a model resistor $g_F$, a model capacitance $C_F$ and the transconductance $-g_{mf}$. The input of the transconductance $-g_{mf}$ is coupled to input voltage $v_{in}$. The first terminal of coupling capacitor $C_C$ is coupled with the first terminals of the resistor $g_X$ and of the capacitance $C_X$, and the second terminal of coupling capacitor $C_C$ is coupled with the output terminal of the transconductance $-g_{mf}$ and with the first terminals of the model resistor $g_F$ and of the capacitance $C_F$. The second terminals of the model resistor $g_F$ and of the capacitance $C_F$ are coupled to the ground potential. Note that transistors $M_G$ and $M_D$ can be approximated as $Z_{GD} \approx 1/g_{mg}$, looking into the source terminal of $M_G$ in this configuration, and are included in the conductance $g_F$. The resulting simplified open-loop transfer function is $$A_{OL}(s) = -\frac{g_{mp} \cdot g_{mc}}{g_X \cdot (g_{out} + g_{mc})} \cdot \frac{1 + s\frac{1}{g_F}\left[C_C + C_F \frac{g_{mf} \cdot C_C \cdot [g_{out} + g_{mc}]}{g_{mc} \cdot g_{mp}}\right] + s^2 \frac{g_{mf} \cdot C_C \cdot C_{out}}{g_F \cdot g_{mc} \cdot g_{mp}}}{\left(1 + s\frac{C_{out}}{g_{out}}\right)\left[1 + s\left(\frac{C_F + C_C}{g_F} + \frac{C_C + C_X}{g_X}\right) + s^2 \frac{C_C C_F + C_C C_X + C_F C_X}{g_X \cdot g_F}\right]}$$

Similar to the previously analyzed compensation scheme, two zeros are generated, that can be controlled by the size of the coupling capacitor $C_C$ and again the "strength" of the compensation.

Alternatively, the fourth transistor $M_G$ may be omitted, and the second terminal of the third transistor $M_F$ may be directly coupled with the first terminal of the fifth transistor $M_D$ (variant is not shown in the Figs.). A current in the branch might not be defined very well, but the bandwidth may even be extended. Consequently, in some examples, the feed-forward compensation circuit $-g_{mf}$ comprises a third transistor $M_F$ and a fifth transistor $M_D$. The third and fifth transistors may each comprise a first terminal, a second terminal and a gate terminal. The first terminal of the third transistor may be coupled to a supply voltage of the buffered flipped voltage follower circuit arrangement. The gate terminal of the third transistor $M_F$ may be the input terminal of the feed-forward compensation circuit $-g_{mf}$. The second terminal of the third transistor $M_F$ may be coupled with the first terminal of the fifth transistor $M_D$. The second terminal of the fifth transistor $M_D$ may be coupled to a ground potential of the buffered flipped voltage follower circuit arrangement. The first terminal of the coupling capacitor $C_C$ may be the output terminal of the feed-forward compensation circuit and the second terminal of the coupling capacitor $C_C$ may be coupled with the second terminal of the third transistor $M_F$ and with the first terminal of the fifth transistor $M_D$. The gate of the fifth transistor $M_D$ may be coupled to the first terminal of the fifth transistor $M_D$. Alternatively, the gate of the fifth transistor $M_D$ may be coupled to a bias voltage, e.g. $V_B$.

More details and aspects of the buffered flipped voltage follower (circuit arrangement) and/or of the LDO comprising the buffered flipped voltage follower (circuit arrangement) are mentioned in connection with the proposed concept or one or more examples described above or below (e.g. FIG. 1 to 9). The buffered flipped voltage follower (circuit arrangement) and/or of the LDO comprising the buffered flipped voltage follower (circuit arrangement) may comprise one or more additional optional features corresponding to one or more aspects of the proposed concept or one or more examples described above or below.

In the following, two design variants are introduced. Both are capacitorless designs, featuring only on-chip capacitances. The two designs mainly differ in the on-chip capacitance at the regulators' output nodes and the pass devices' gate drivers. In the first case, a very small output capacitance of only 25 µF may be used. In this design the pass device's gate driver may be a rather simple high speed source follower. The second design in contrast employs 100 µF output capacitance and may require a more complicated high speed gate driver that is based on the so-called super source follower.

Figure 5G:
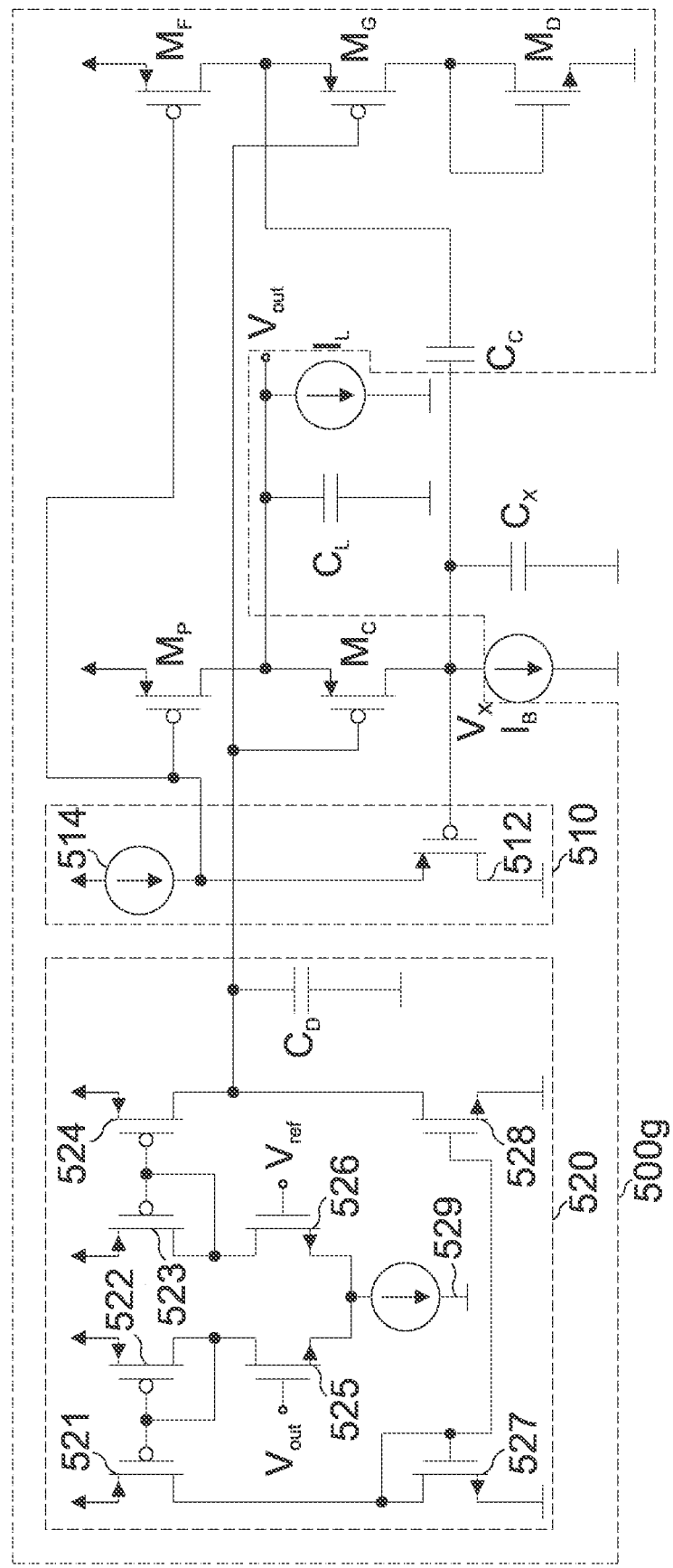
FIGS. 5g and 5h show schematic diagrams of examples of buffered flipped voltage follower circuit arrangements, wherein an outer control loop of the buffered flipped voltage follower circuit arrangements is shown.
Figures 2, 5H:
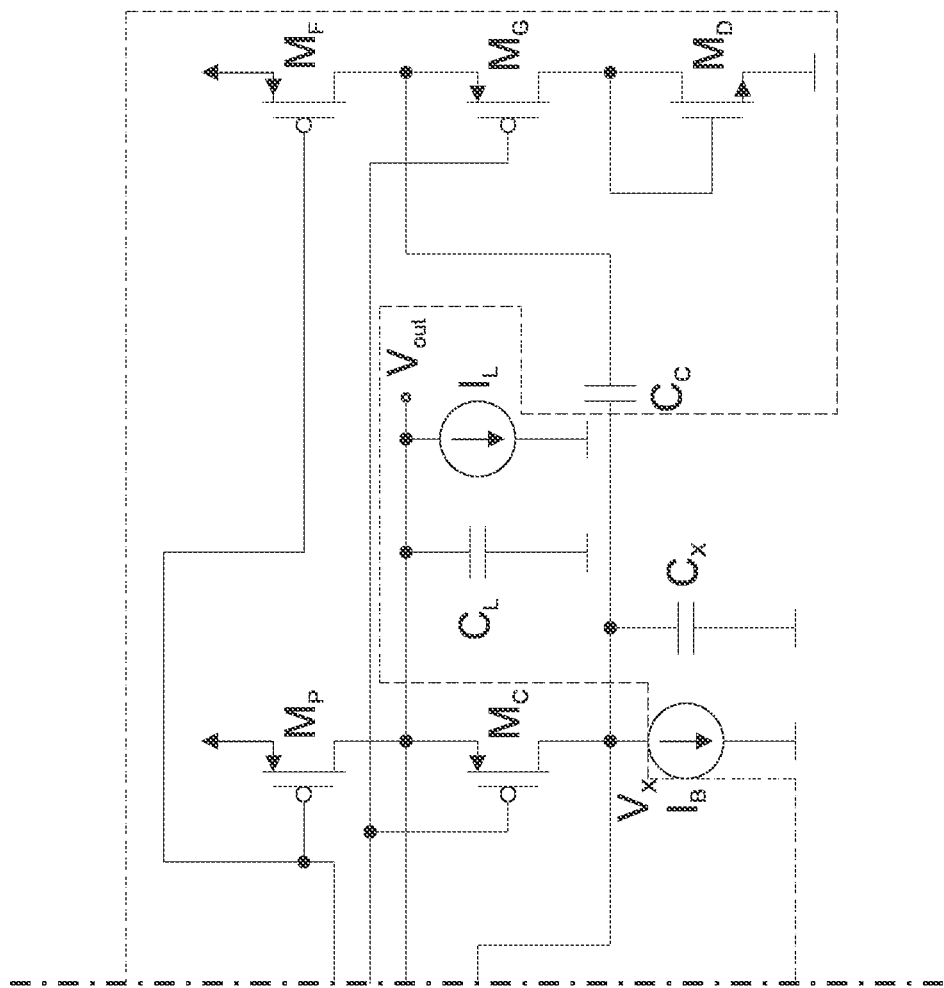

In the first design, in an example, the ratio between the pass device $M_P$ and the feed forward transistor $M_F$ is 450/6. FIG. 5g shows a schematic of the implemented first LDO regulator/buffered FVF 500g including the outer biasing loop and the pass device's gate driver. In addition to circuit of FIG. 5c, the circuit of FIG. 5g comprises a high speed source follower 510 implementing the buffer (circuit) and an operational amplifier 520. In other words, the buffer circuit of the buffered flipped voltage follower circuit arrangement may comprise a source follower circuit 510, e.g. the high speed source follower 510 shown in FIG. 5g. The source follower may be a voltage controlled voltage source (with unity gain). The high speed source follower of FIG. 5g comprises a transistor 512 and a current source 514. The first terminal of the current source 514 is coupled to a supply voltage, and the second terminal of the current source 514 is coupled to the gate terminal of the pass device transistor $M_P$, to the input of the feed-forward compensation transconductance $-g_{mf}$, and to the first terminal of the transistor 512 (the source terminal of the p-channel MOSFET). The second terminal (the drain terminal) of the transistor 512 is coupled to the ground potential, and the gate terminal of the transistor 512 is coupled to node $V_X$ and is the input terminal of the buffer. The operational amplifier 520 comprises transistors 521-528, a current source 529 and a capacitance $C_D$. In FIGS. 5g and 5h, the transistors 521-524 are implemented as p-channel MOSFETs, and the transistors 525 to 528 are implemented as n-channel MOSFETS. The first terminals (source terminals) of the transistors 521-524 are coupled to the supply voltage. The second terminal of transistor 521 is coupled with the first terminal (drain terminal) of transistor 527 and the second terminal of transistor 522 is coupled with the first terminal (drain terminal) of transistor 525 and with the gate terminals of transistors 521 and 522. The second terminal of transistor 524 is coupled with the first terminal (drain terminal) of transistor 528 and the second terminal of transistor 523 is coupled with the first terminal (drain terminal) of transistor 526 and with the gate terminals of transistors 523 and 524. The gate terminal of transistor 525 is coupled to the output voltage terminal $V_{out}$ (the inverting input terminal of the operational amplifier), the gate terminal of transistor 526 is coupled to the reference voltage terminal $V_{ref}$ (the non-inverting input terminal of the operational amplifier). The second terminals (source terminals) of the transistors 525 and 526 are coupled with the first terminal of current source 529. The second terminal of current source 529 is coupled to the ground potential. The gate terminals of transistors 527 and 528 are coupled with the first terminal of transistor 527, and the second terminals (source terminals) of transistors 527 and 528 are coupled to the ground potential. The second terminal of transistor 524 and the first terminal of transistor 528 are coupled to a first terminal of capacitance $C_D$ and to an output terminal of the operational amplifier 520, providing the bias voltage $V_B$. The second terminal of capacitance $C_D$ is coupled to the ground potential.

Figure 6A:
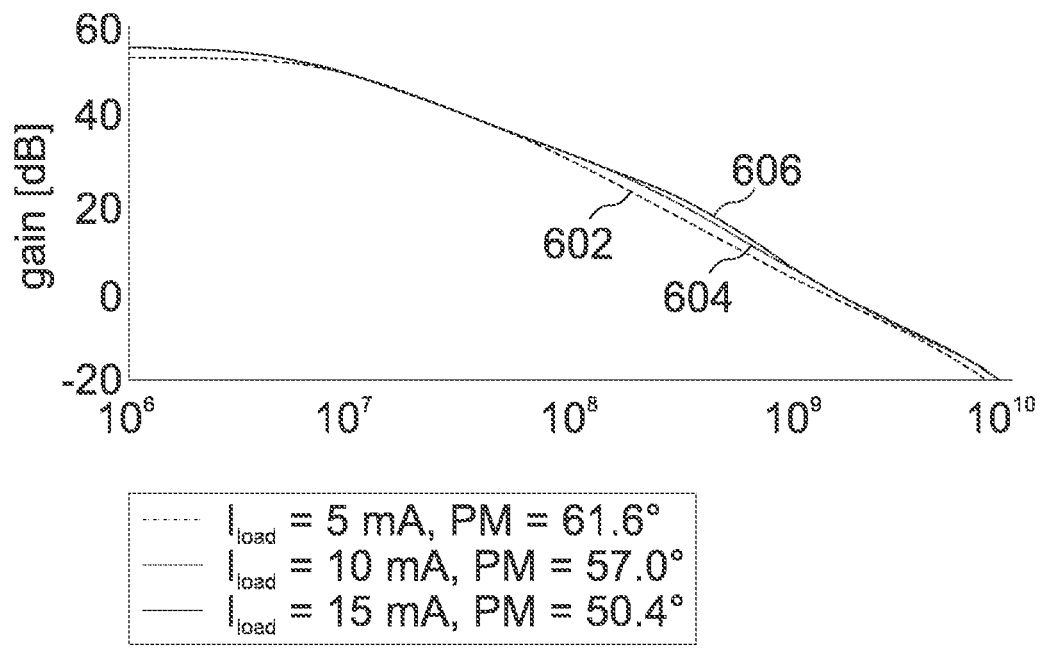
FIGS. 6a and 6b show an open loop transfer function for different load currents for a first design of a buffered flipped voltage follower-based low dropout regulator.
Figure 6B:
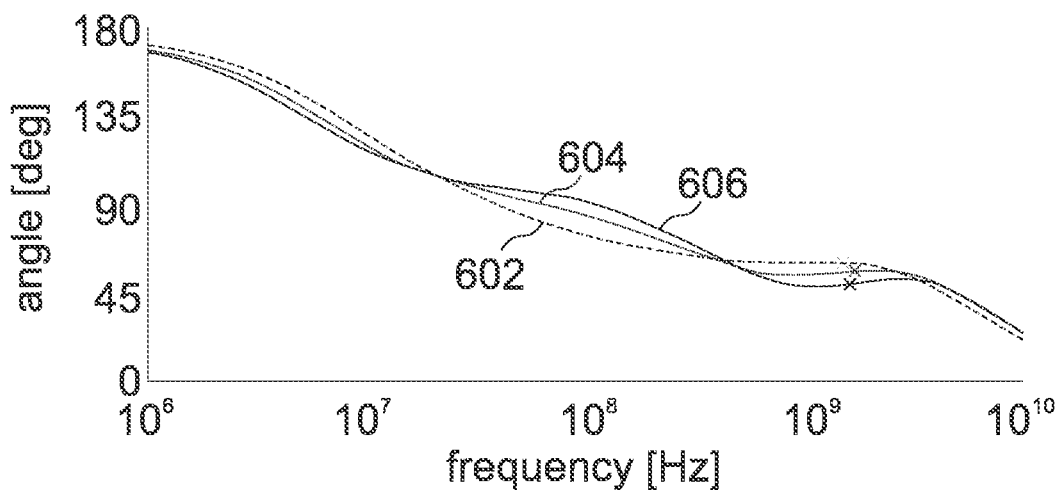
Figure 6C:
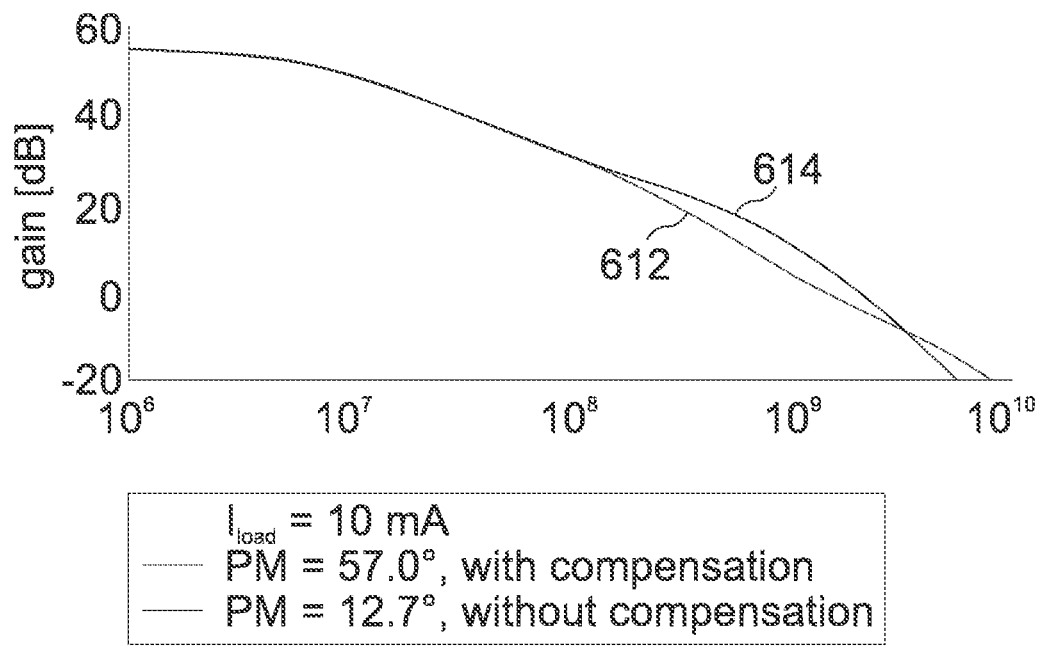
FIGS. 6c and 6d show a comparison of an open loop transfer function for a first design of a buffered flipped voltage follower-based low dropout regulator with and without a compensation branch.
Figure 6D:
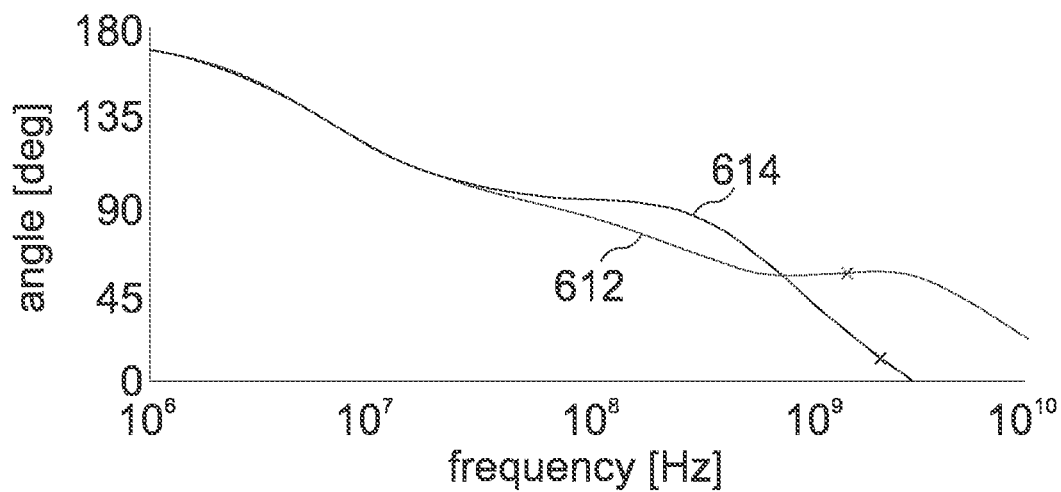
Figure 6E:
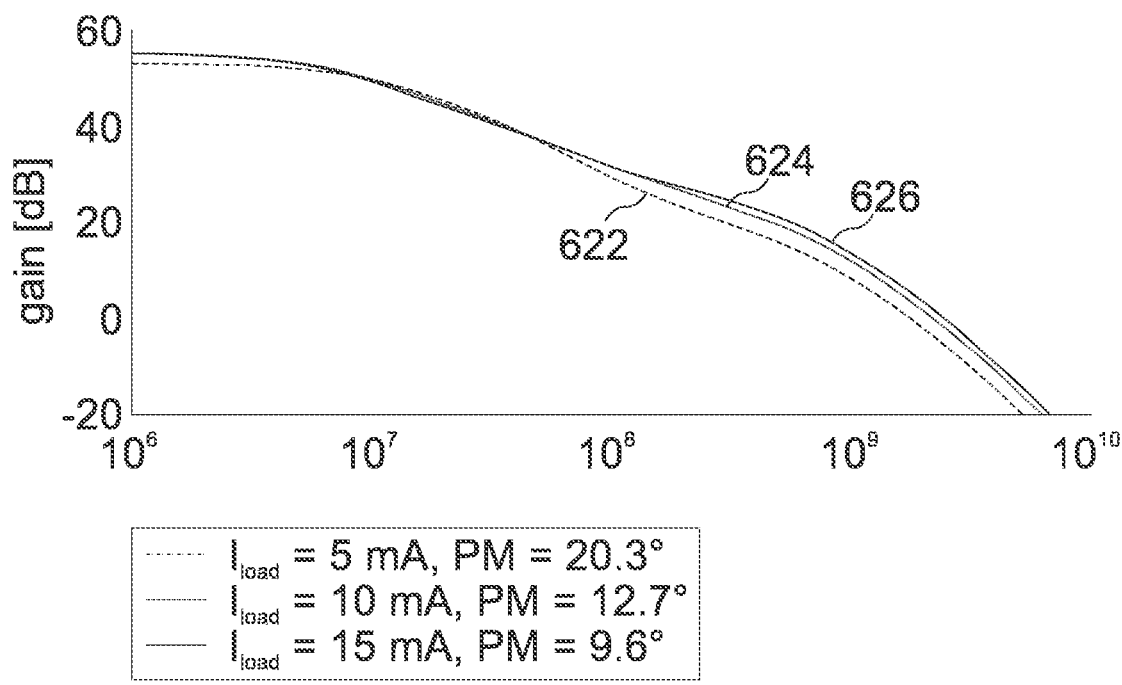
FIGS. 6e and 6f show an open loop transfer function for different load currents for a first design of a buffered flipped voltage follower-based low dropout regulator with the compensation branch disconnected.
Figure 6F:
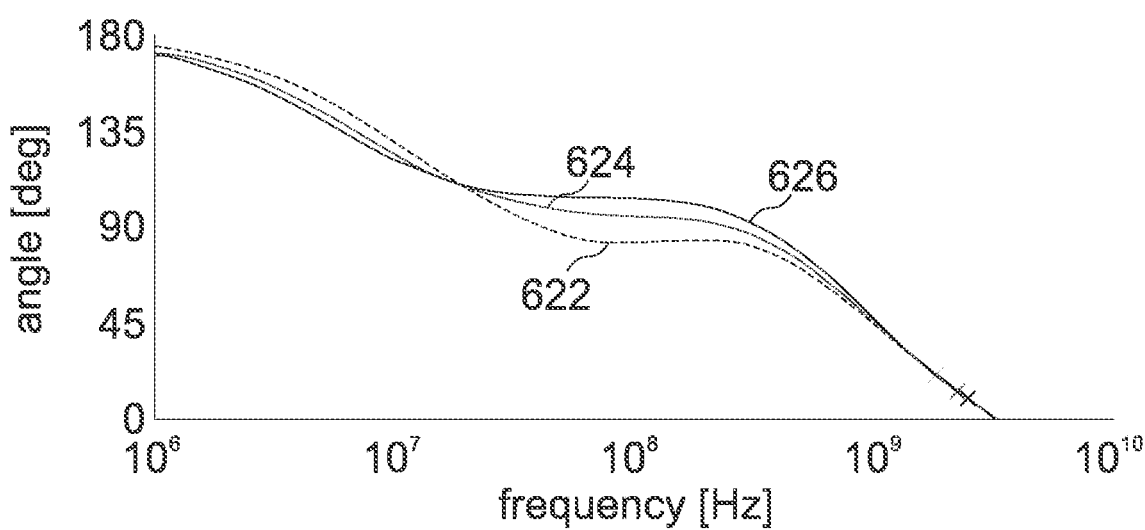

The open loop transfer function according to a simulation is shown in FIGS. 6a and 6b for different load currents of the first design. Line 602 shows the open loop transfer function for a load current of 5 mA, line 604 shows the open loop transfer function for a load current of 10 mA and line 606 shows the open loop transfer function for a load current of 15 mA. At 5 mA load, a phase margin of 61.6° is achieved, 57° at 10 mA and 50.4° at 15 mA load. For comparison, the open loop bode plots of the same circuit, with the compensation branch disconnected, is shown in FIGS. 6c and 6d. Line 612 shows the open loop transfer function for a load current of 10 mA with compensation, achieving a phase margin of 57°, and line 614 shows the open loop transfer function load current of 10 mA with the compensation branch disconnected, achieving a phase margin of 12.7°. The phase margin is improved by more than 40°. The unity gain frequency of the regulator, with the compensation active, is well above 1 GHz in all cases and the open loop gain at 200 MHz is above 20 dB, providing a low output resistance at these high frequencies, which is shown in FIGS. 6e and 6f. FIGS. 6e and 6f show the open-loop transfer function of the first LDO regulator with the compensation branch disconnected for comparison. The uncompensated circuit exhibits the initially discussed two-pole behavior similar to the bode plot sketched in FIG. 4b. Line 622 shows the open loop transfer function for a load current of 5 mA, line 624 shows the open loop transfer function for a load current of 10 mA and line 626 shows the open loop transfer function for a load current of 15 mA. At 5 mA load, a phase margin of 20.3° is achieved, 12.7° at 10 mA and 9.6° at 15 mA load.

Figure 6G:
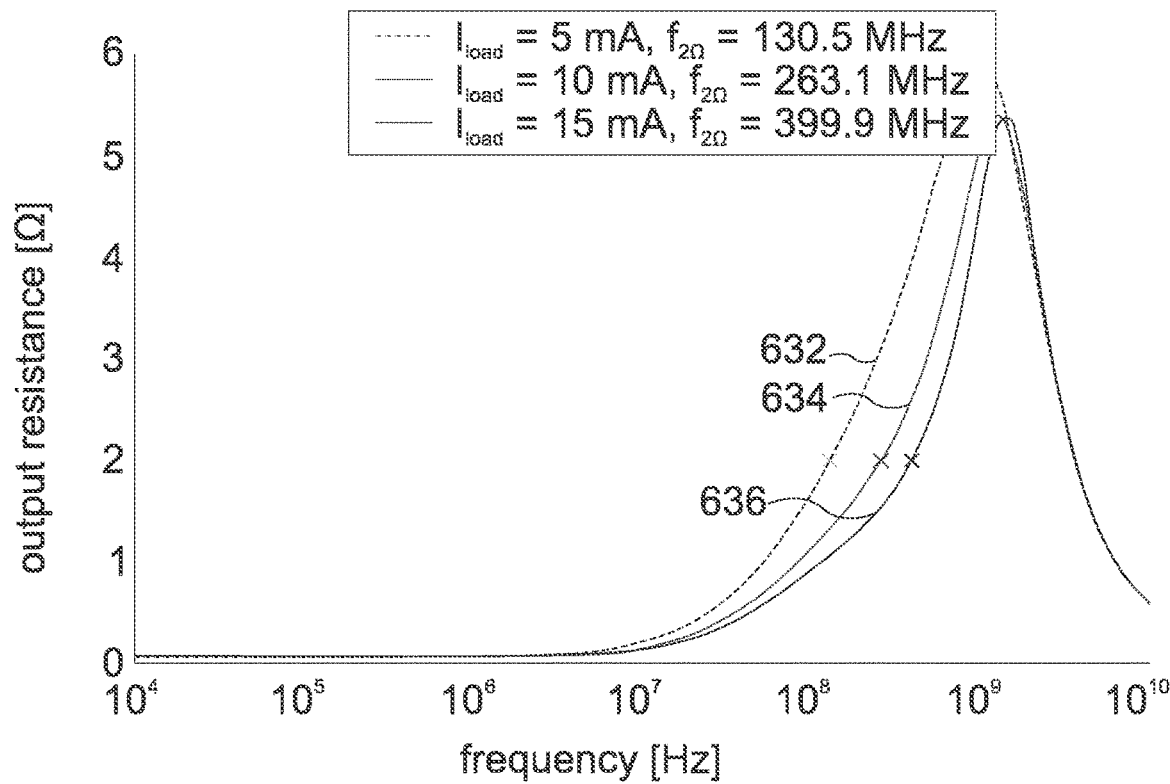
FIG. 6g shows the output resistance for different load currents of a first design of a buffered flipped voltage follower-based low dropout regulator.
Figure 6H:
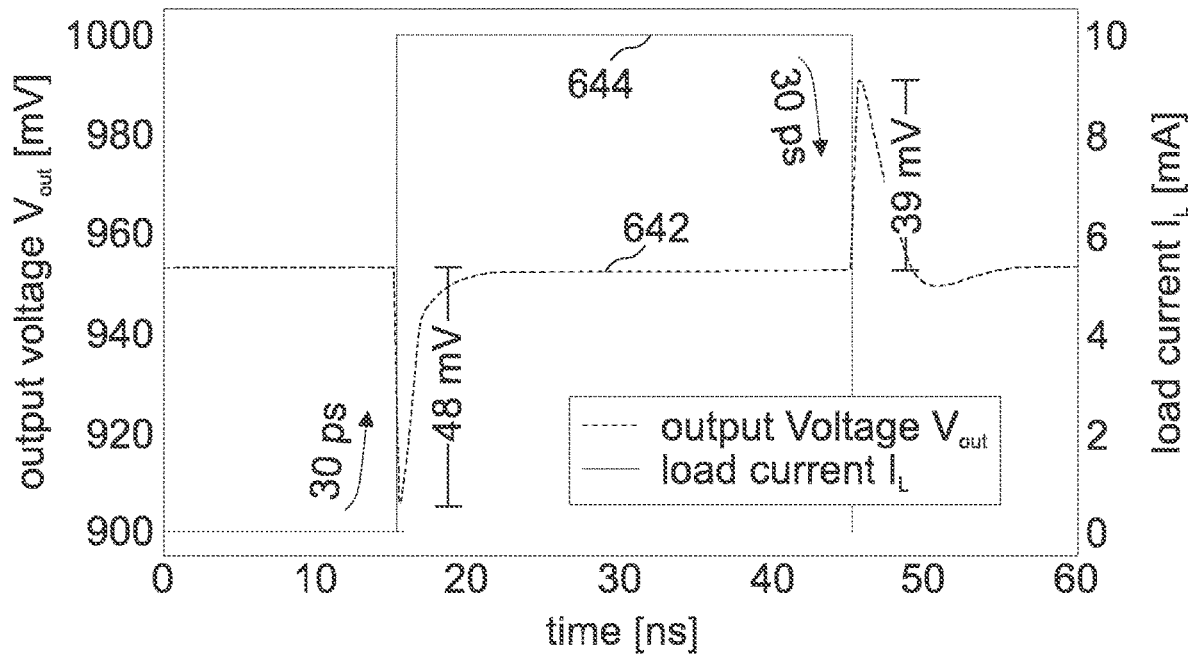
FIG. 6h shows a transient behavior of a first design of a buffered flipped voltage follower-based low dropout regulator with a 10 mA current step applied.

In an example, the worst case phase margin is 49.5° at 15 mA load current, the circuit consumes 2.1 mA in the worst case over PVT (Process, Voltage and Temperature compensation technique), where roughly 120 pA (~6%) is used by the compensation branch. The peak current efficiency at 15 mA load current is 89.1% in the example. FIG. 6g shows the output resistance for different load currents of the first regulator design. Line 632 shows the output resistance at 5 mA load with $f_{2\Omega}$=130.5 MHz, Line 634 shows the output resistance at 10 mA load with $f_{2\Omega}$=263.1 MHz, and Line 636 shows the output resistance at 15 mA load with $f_{2\Omega}$=399.9 MHz. $f_{2\Omega}$ is the frequency, at which the output resistance reaches 2Ω. In other words, up to this frequency, the output resistance is smaller than 2Ω. The proposed architecture enables ultra-high regulator bandwidths at low power consumption. FIG. 6h shows the transient behavior with a 10 mA current step applied. Line 642 shows the output voltage $V_{out}$ and line 644 shows the load current $I_L$.

More details and aspects of the buffered flipped voltage follower (circuit arrangement) and/or of the LDO comprising the buffered flipped voltage follower (circuit arrangement) are mentioned in connection with the proposed concept or one or more examples described above or below (e.g. FIG. 1 to 9). The buffered flipped voltage follower (circuit arrangement) and/or of the LDO comprising the buffered flipped voltage follower (circuit arrangement) may comprise one or more additional optional features corresponding to one or more aspects of the proposed concept or one or more examples described above or below.

In a further example, the second design has an on-chip capacitance of 100 µF. The ratio between the pass device $M_P$ and the feed forward transistor $M_F$ in the example is 450/4. Contrary to the first design, it features an improved high-speed gate driver that is based on a modified super source-follower. The implemented schematic is shown in FIG. 5h. FIG. 5h shows a schematic of the second implemented LDO regulator/buffered FVF 500h including the outer biasing loop and the extended super source-follower based gate driver. The outer biasing loop is implemented by the operational amplifier 520, which may be implemented similar to the operational amplifier 520 as introduced in connection with FIG. 5g. The LDO/buffered FVF of FIG. 5h further comprises super source follower 530, implementing the buffer (circuit) of the buffered FVF. In other words, the buffer circuit of the buffered flipped voltage follower circuit arrangement may comprise a super source follower circuit 530, e.g. the super source follower 530 shown in FIG. 5h. For example, the super source follower circuit 530 may be a common drain amplifier. The super source follower comprises current sources 531 and 538, transistors 532, 534, 536 and 537, a capacitance 533 and a resistor 535. The first terminal of current source 531 is coupled to a supply voltage of the buffered FVF, the second terminal of current source 531 is coupled with the first terminal of transistor 532 (e.g. the source terminal of p-channel MOSFET 532), with the first terminal of transistor 537 (e.g. the drain terminal of n-channel MOSFET 537) and with the output terminal of the buffer (circuit). The second terminal (e.g. the drain terminal) of transistor 532 is coupled with the first terminal of transistor 536 (e.g. the drain terminal of n-channel MOSFET 536) and with the gate terminal of transistor 537. The gate terminal of transistor 532 is coupled with the first terminal of capacitance 533, with the first terminal of current source 538, and with the second terminal of transistor 534 (e.g. with the source terminal of n-channel MOSFET 534). The second terminal of capacitance 533 is coupled with the gate terminal of transistor 536 and with the first terminal of resistor 535. The second terminal of resistor 535 is coupled to a bias voltage of the buffered FVF circuit. The first terminal of transistor 534 (e.g. the drain terminal of n-channel MOSFET 534) is coupled to the output voltage terminal of the buffered FVF. The gate terminal of transistor 534 is the input terminal of the buffer (circuit) and is coupled to node $V_X$. The second terminals of transistors 536, 537 and of current source 538 are coupled to the ground potential. All simulations have been performed on schematic level with estimated parasitic capacitances and resistances only.

Figure 6I:
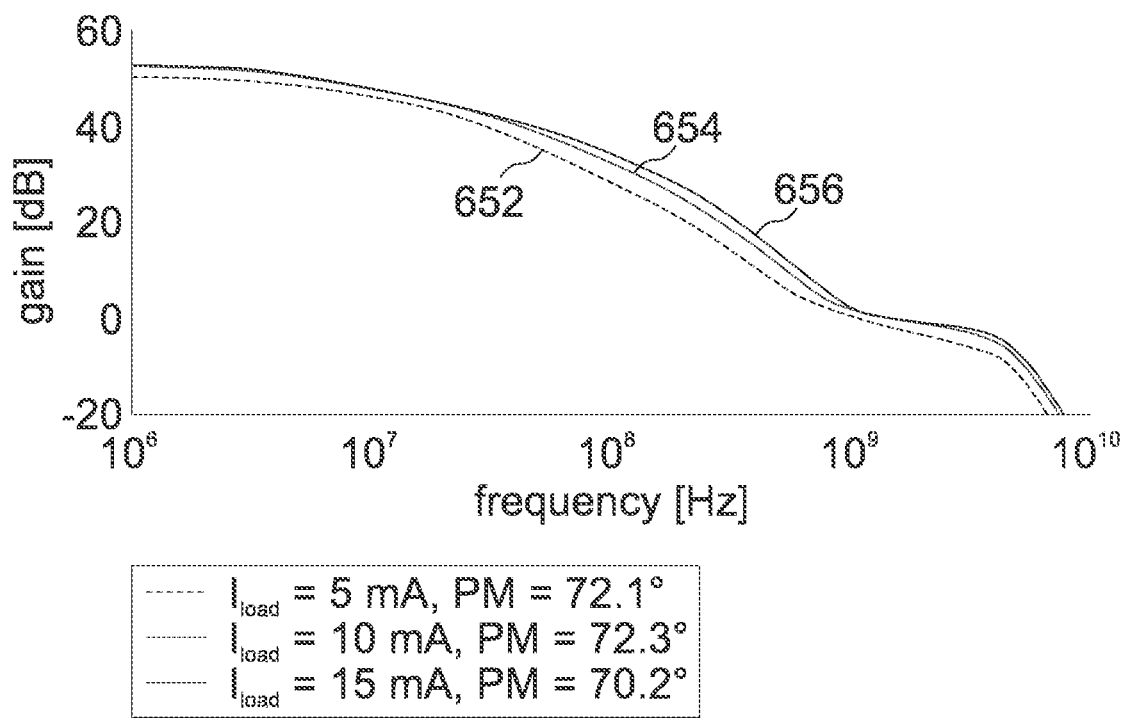
FIGS. 6i and 6j show an open loop transfer function for different load currents for a second design of a buffered flipped voltage follower-based low dropout regulator.
Figure 6J:
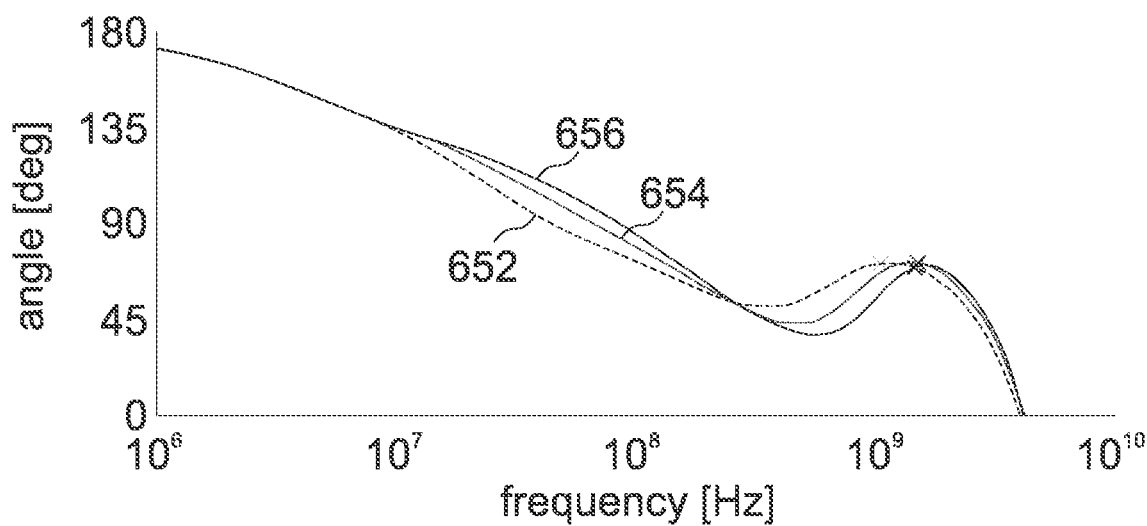
Figure 6K:
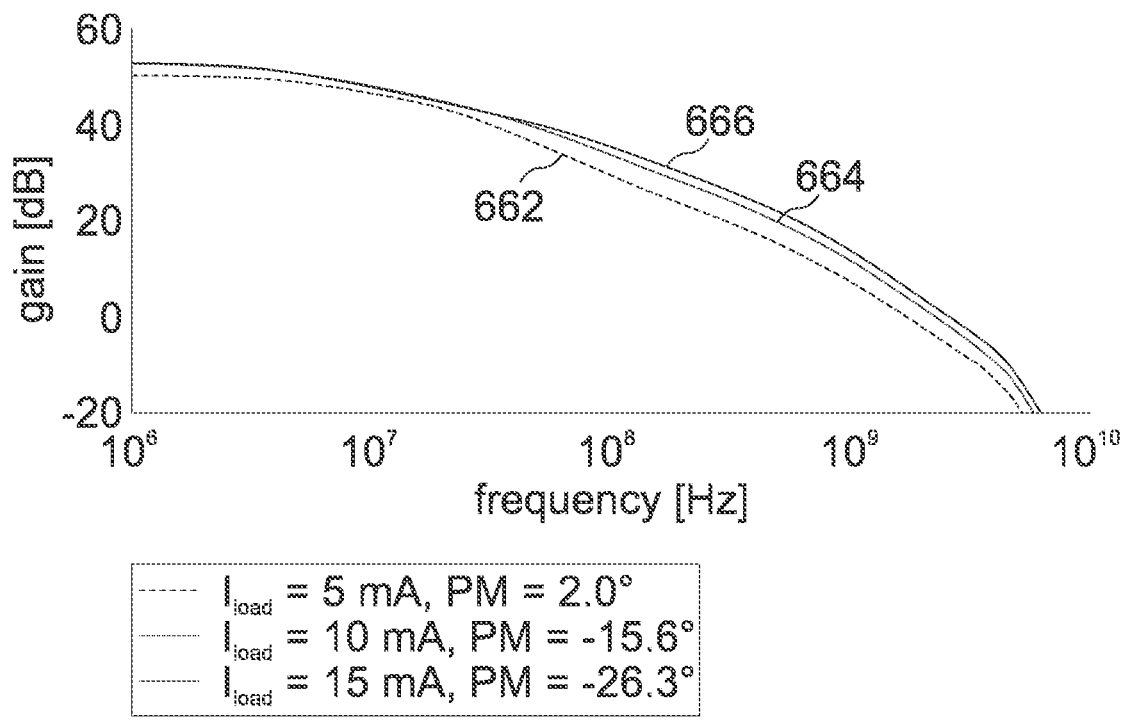
FIGS. 6k and 6l show an open loop transfer function for different load currents for a second design of a buffered flipped voltage follower-based low dropout regulator with the compensation branch disconnected.
Figure 6L:
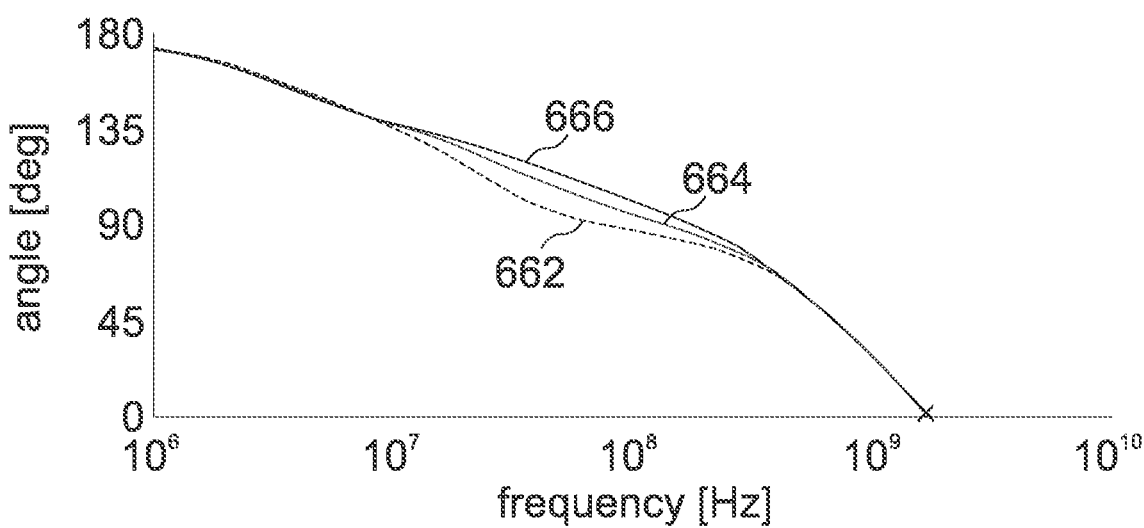
Figure 6M:
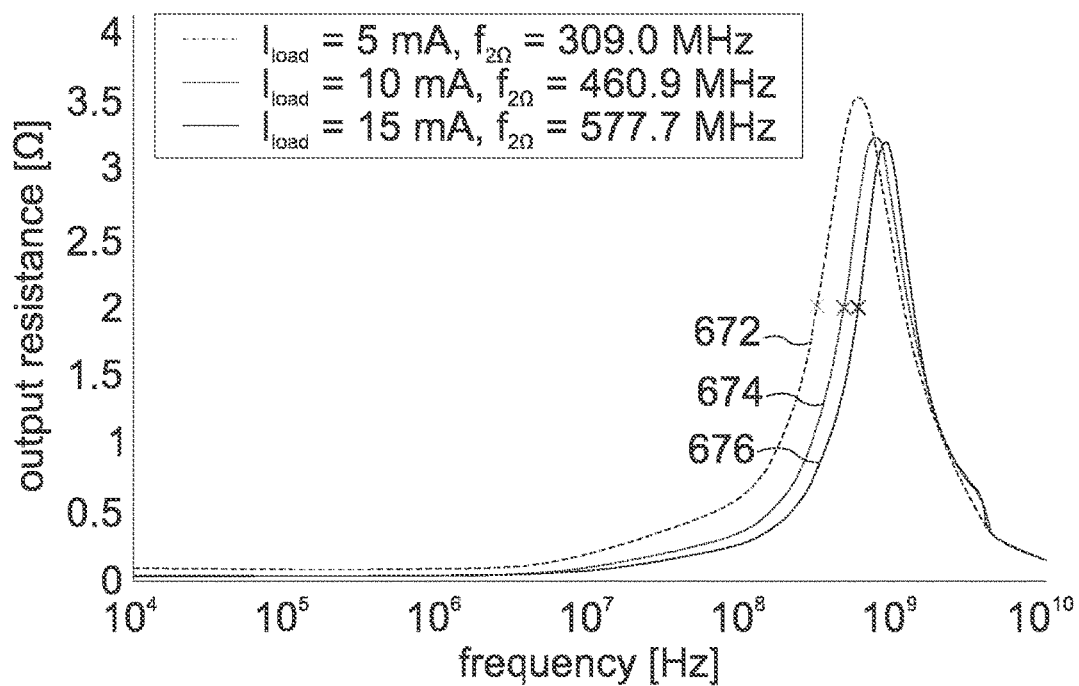
FIG. 6m shows the output resistance for different load currents of a second design of a buffered flipped voltage follower-based low dropout regulator.
Figure 6N:
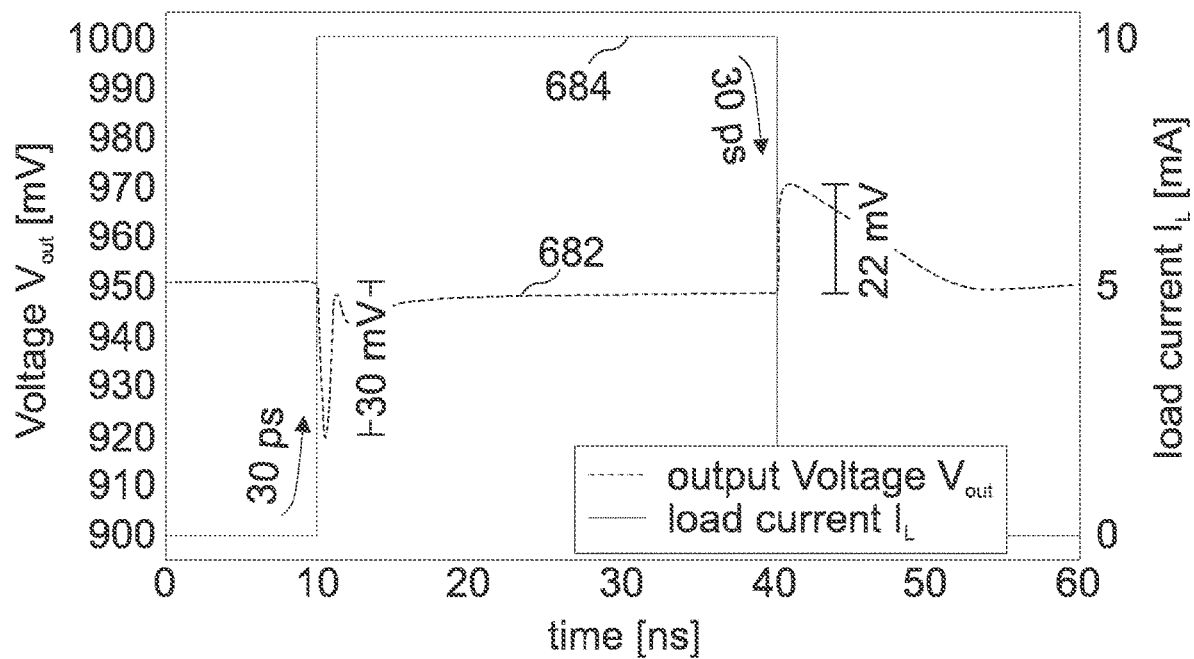
FIG. 6n shows a transient behavior of a second design of a buffered flipped voltage follower-based low dropout regulator with a 10 mA current step applied.

The open loop transfer function is shown in FIGS. 6i and 6j for different load currents. Line 652 shows the open loop transfer function for $I_{load}$=5 mA, achieving a phase margin of 72.1°, Line 654 shows the open loop transfer function for $I_{load}$=10 mA, achieving a phase margin of 72.3°, and Line 656 shows the open loop transfer function for $I_{load}$=15 mA, achieving a phase margin of 70.2°. For comparison, the open loop bode plots of the same circuit, with the compensation branch disconnected, are shown in FIGS. 6k and 6l. Line 662 shows the open loop transfer function for $I_{load}$=5 mA, achieving a phase margin of 2.0°, Line 664 shows the open loop transfer function for $I_{load}$=10 mA, achieving a phase margin of −15.6°, and Line 666 shows the open loop transfer function for $I_{load}$=15 mA, achieving a phase margin of −26.3°. The uncompensated circuit exhibits the initially discussed two-pole behavior similar to the bode plot sketched in FIG. 4b. Without the compensation circuitry, the circuit is unstable. The unity gain frequency of the regulator, with the compensation active, is well above 1 GHz in all cases and the open loop gain at 200 MHz is above 20 dB, providing a low output resistance at these high frequencies, which is shown in FIG. 6m. FIG. 6m shows the output resistance of the second regulator for different load currents. Line 672 shows the output resistance for $I_{load}$=5 mA, with $f_{2\Omega}$=309.0 MHz, Line 672 shows the output resistance for $I_{load}$=10 mA, with $f_{2\Omega}$=460.9 MHz, and Line 676 shows the output resistance for $I_{load}$=15 mA, with $f_{2\Omega}$=577.7 MHz. In the example, the worst case phase margin is 52.1° at 15 mA load current, the circuit consumes 1.2 mA in the worst case over PVT, where roughly 75 pA (~6%) is used by the compensation branch. The peak current efficiency at 15 mA load current is 93.8%. Finally FIG. 6n shows the transient behavior (transient output voltage) with a 10 mA current step applied. Line 682 shows the output voltage $V_{out}$ and Line 684 shows the load current $I_L$. The proposed architecture may enable ultra-high regulator bandwidths at low power consumption.

More details and aspects of the buffered flipped voltage follower (circuit arrangement) and/or of the LDO comprising the buffered flipped voltage follower (circuit arrangement) are mentioned in connection with the proposed concept or one or more examples described above or below (e.g. FIG. 1a to 9). The buffered flipped voltage follower (circuit arrangement) and/or of the LDO comprising the buffered flipped voltage follower (circuit arrangement) may comprise one or more additional optional features corresponding to one or more aspects of the proposed concept or one or more examples described above or below.

Figure 7A:
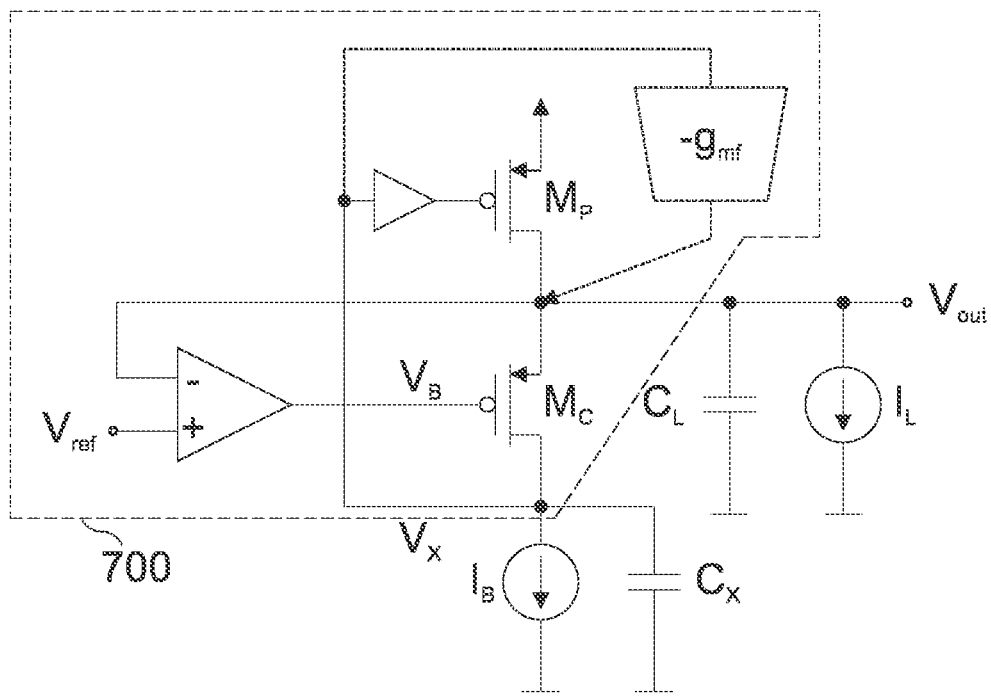
FIG. 7a shows a schematic diagram of a buffered flipped voltage follower circuit arrangement according to an example.

In at least some examples, the feed-forward compensation circuit $-g_{mf}$ is not necessarily coupled to the gate of the pass device transistor and to node $V_X$. FIG. 7a shows a schematic diagram of a buffered flipped voltage follower circuit arrangement, e.g. of an LDO comprising a buffered flipped voltage follower circuit arrangement, according to an example. The buffered flipped voltage follower circuit arrangement may be implemented similar to one of the buffered flipped voltage follower circuit arrangements of FIGS. 2 to 5h. The buffered flipped voltage follower circuit arrangement comprises a pass transistor and a common gate amplifier transistor $M_C$. A first terminal of the pass transistor is coupled to a supply voltage of the buffered flipped voltage follower circuit arrangement. A second terminal of the pass transistor is coupled to a first terminal of the common-gate amplifier transistor $M_C$ and to an output voltage terminal of the buffered flipped voltage follower circuit arrangement. The feed-forward compensation circuit $-g_{mf}$ is suitable for providing a feed forward compensation between a second terminal of the common-gate amplifier transistor $M_C$ and the output voltage terminal of the buffered flipped voltage follower circuit arrangement. In other words, in contrast to the buffered feed-forward compensation circuits introduced in connection with FIGS. 2 to 5h, an input of the feed-forward compensation circuit $-g_{mf}$ is coupled with the second terminal of the common-gate amplifier transistor $M_C$ and the output of the feed-forward compensation circuit is coupled with the output voltage terminal of the buffered flipped voltage follower circuit arrangement.

Figure 7B:
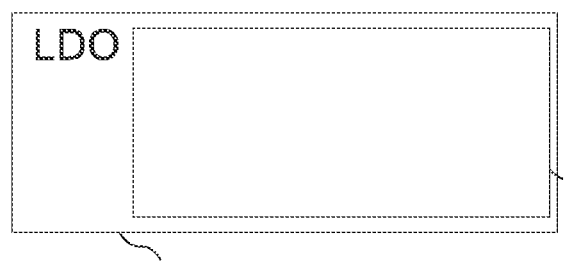
FIG. 7b shows a block diagram of a low dropout voltage regulator according to an example.

FIG. 7b shows a block diagram of a low dropout voltage regulator 100 according to an example. In some examples, the low dropout voltage regulator 100 comprises a buffered flipped voltage follower circuit arrangement according to one of the previous examples, e.g. one of the flipped voltage follower circuit arrangements 200; 300a; 300b; 300c; 500a; 500b; 500c; 500d; 500g; 500h; 700.

For example, FIG. 7b shows a low dropout voltage regulator 100 comprising a feed-forward compensation circuit $-g_{mf}$. The feed-forward compensation circuit $-g_{mf}$ is suitable for at least partially compensating a phase shift within a control loop of the low dropout voltage regulator. For example, the control loop may lead from the output voltage terminal of the buffered FVF, via common-gate amplifier transistor $M_C$, the buffer circuit and the pass transistor $M_P$ to the output voltage terminal. For example, as shown in connection with FIG. 7a, the LDO may comprise a buffered flipped voltage follower (circuit arrangement) according to one of the previous examples. For example, the low dropout voltage regulator may comprise a pass transistor $M_P$ (e.g. the first transistor) and a common-gate amplifier transistor $M_C$ (e.g. the second transistor). A first terminal of the pass transistor may be coupled to a supply voltage of the low dropout voltage regulator. A second terminal of the pass transistor may be coupled to a first terminal of the common-gate amplifier transistor $M_C$ and to an output voltage terminal of the low dropout voltage regulator. The feed-forward compensation circuit $-g_{mf}$ may be suitable for providing a feed forward compensation between a second terminal of the common-gate amplifier transistor $M_C$ and the output voltage terminal of the low dropout voltage regulator.

Alternatively, the LDO may comprise a buffered flipped voltage follower (circuit arrangement) according to one of the examples introduced in connection with FIGS. 2 to 5h. The low dropout voltage regulator may comprise a pass transistor $M_P$ (e.g. the first transistor) and a common-gate amplifier transistor $M_C$. A first terminal of the pass transistor may be coupled to a supply voltage of the low dropout voltage regulator. A second terminal of the pass transistor may be coupled to a first terminal of the common-gate amplifier transistor $M_C$ and to an output voltage terminal of the low dropout voltage regulator. The feed-forward compensation circuit $-g_{mf}$ may be suitable for providing a feed forward compensation between a gate terminal of the pass transistor and a second terminal of the common-gate amplifier transistor $M_C$.

More details and aspects of the buffered flipped voltage follower (circuit arrangement) and/or of the LDO comprising the buffered flipped voltage follower (circuit arrangement) are mentioned in connection with the proposed concept or one or more examples described above or below (e.g. FIG. 1a to 9). The buffered flipped voltage follower (circuit arrangement) and/or of the LDO comprising the buffered flipped voltage follower (circuit arrangement) may comprise one or more additional optional features corresponding to one or more aspects of the proposed concept or one or more examples described above or below.

Figure 8:
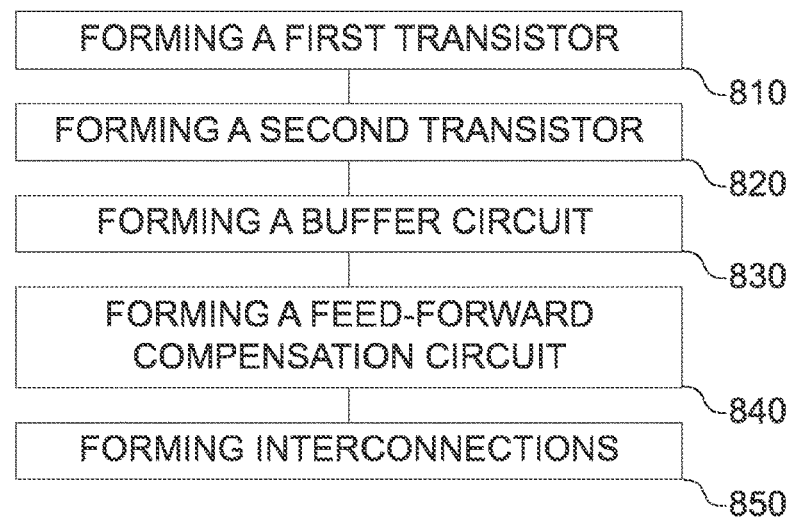
FIG. 8 shows a flow chart of a method for forming a buffered flipped voltage follower circuit arrangement.

FIG. 8 shows a flow chart of a method for forming a buffered flipped voltage follower circuit arrangement 200; 300a; 300b; 300c; 500a; 500b; 500c; 500d; 500g; 500h, e.g. for forming the buffered flipped voltage follower circuit arrangement according to one of the examples introduced in connection with FIGS. 2 to 7b. The method comprises forming 810 a first transistor $M_P$ comprising a first terminal, a second terminal and a gate terminal. The method further comprises forming 820 a second transistor $M_C$ comprising a first terminal, a second terminal and a gate terminal. The method further comprises forming 830 a buffer circuit comprising an input terminal and an output terminal. The method further comprises forming 840 a feed-forward compensation circuit $-g_{mf}$ comprising an input terminal and an output terminal. The method further comprises forming 850 interconnections between the first transistor $M_P$, the second transistor $M_C$, the buffer circuit and the feed-forward compensation circuit $-g_{mf}$, e.g. to form signal traces, vias etc. to couple the first transistor $M_P$, the second transistor $M_C$, the buffer circuit and the feed-forward compensation circuit $-g_{mf}$. The first terminal of the first transistor $M_P$ is coupled to a supply voltage of the flipped voltage follower circuit. The second terminal of the first transistor $M_P$ is coupled with the first terminal of the second transistor $M_C$ and with an output voltage terminal of the buffered flipped voltage follower circuit arrangement. The second terminal of the second transistor $M_C$ is coupled with the input terminal of the buffer circuit and with the output terminal of the feed-forward compensation circuit $-g_{mf}$. The gate terminal of the first transistor $M_P$ is coupled with the output terminal of the buffer circuit and with the input terminal of the feed-forward compensation circuit $-g_{mf}$.

More details and aspects of the buffered flipped voltage follower (circuit arrangement), the LDO comprising the buffered flipped voltage follower (circuit arrangement), and/or of the method for forming the buffered flipped voltage follower (circuit arrangement) are mentioned in connection with the proposed concept or one or more examples described above or below (e.g. FIG. 1a to 9). The buffered flipped voltage follower (circuit arrangement), the LDO comprising the buffered flipped voltage follower (circuit arrangement), and/or of the method for forming the buffered flipped voltage follower (circuit arrangement) may comprise one or more additional optional features corresponding to one or more aspects of the proposed concept or one or more examples described above or below.

Figure 9A:
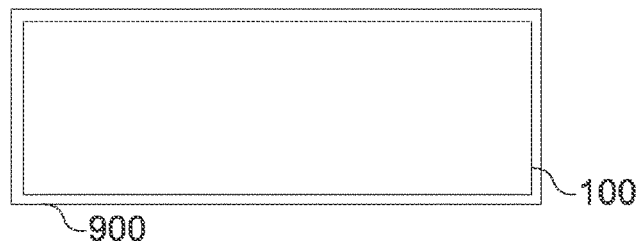
FIG. 9a shows a block diagram of a capacitive digital-to-analog converter comprising a low dropout voltage regulator according to an example.

FIG. 9a shows a block diagram of a capacitive digital-to-analog converter (CDAC) 900 comprising a low dropout voltage regulator according to one of the examples introduced in connection with FIG. 7b.

Figure 9B:
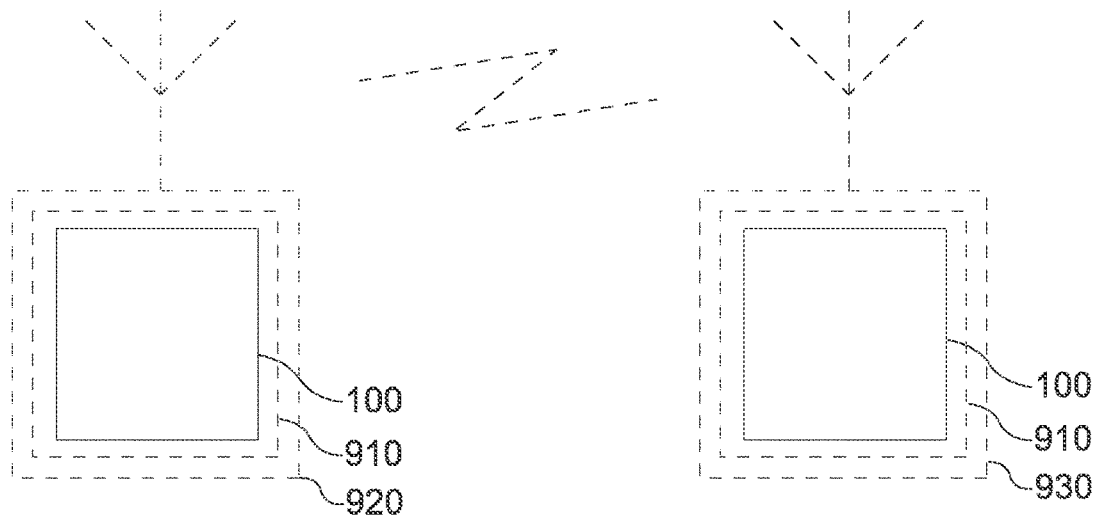
FIG. 9b shows a block diagram of a transceiver for wireless communication, a mobile communication device and a base station transceiver comprising a low dropout voltage regulator according to an example.

FIG. 9b shows a block diagram of a transceiver 910 for wireless communication, a mobile communication device 920 and a base station transceiver 930 comprising a low dropout voltage regulator according to one of the examples introduced in connection with FIG. 7b.

A base station transceiver can be operable to communicate with one or more active mobile transceivers and a base station transceiver can be located in or adjacent to a coverage area of another base station transceiver, e.g. a macro cell base station transceiver or small cell base station transceiver. Hence, examples may provide a mobile communication system comprising one or more mobile transceivers and one or more base station transceivers, wherein the base station transceivers may establish macro cells or small cells, as e.g. pico-, metro-, or femto cells. A mobile communication device may correspond to a smartphone, a cell phone, user equipment, radio equipment, a mobile, a mobile station, a laptop, a notebook, a personal computer, a Personal Digital Assistant (PDA), a Universal Serial Bus (USB)-stick, a car, a mobile relay transceiver for D2D communication, etc. A mobile transceiver may also be referred to as User Equipment (UE) or mobile in line with the 3GPP terminology.

A base station transceiver can be located in the fixed or stationary part of the network or system. A base station transceiver may correspond to a remote radio head, a transmission point, an access point, radio equipment, a macro cell, a small cell, a micro cell, a femto cell, a metro cell etc. A base station transceiver may correspond to a base station understood as a logical concept of a node/entity terminating a radio bearer or connectivity over the air interface between a terminal/mobile transceiver and a radio access network. A base station transceiver can be a wireless interface of a wired network, which enables transmission of radio signals to a UE or mobile transceiver. Such a radio signal may comply with radio signals as, for example, standardized by 3GPP or, generally, in line with one or more of the above listed systems. Thus, a base station transceiver may correspond to a NodeB, an eNodeB, a Base Transceiver Station (BTS), an access point, a remote radio head, a transmission point, a relay transceiver etc., which may be further subdivided in a remote unit and a central unit.

Figure 10:
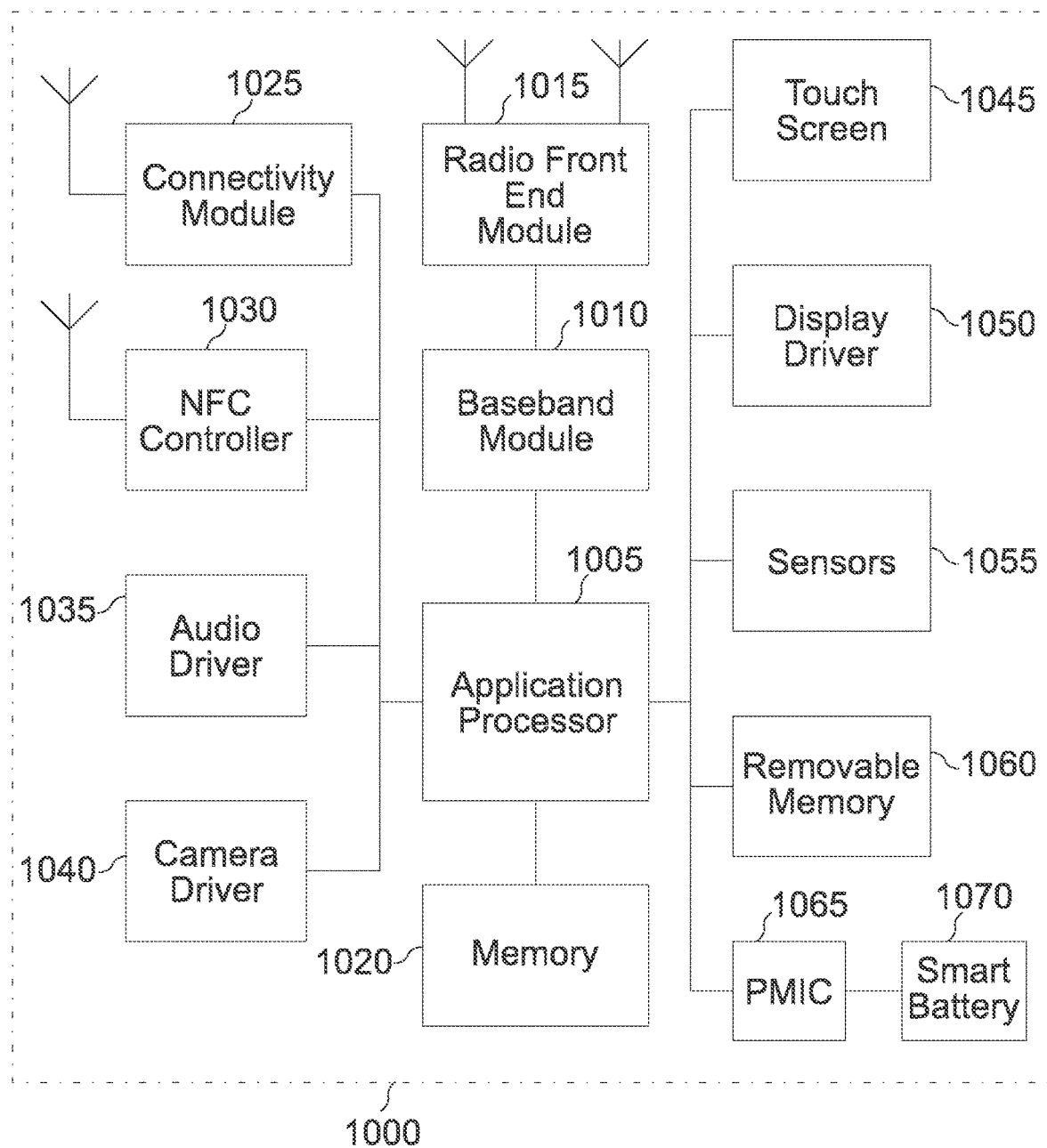
FIG. 10 illustrates a user device in accordance with an aspect.

FIG. 10 illustrates a user device 1000, e.g. the mobile communication device 920, in accordance with an aspect. The user device 1000 may be a mobile device in some aspects and includes an application processor 1005, baseband processor 1010 (also referred to as a baseband module), radio front end module (RFEM) 1015, memory 1020, connectivity module 1025, near field communication (NFC) controller 1030, audio driver 1035, camera driver 1040, touch screen 1045, display driver 1050, sensors 1055, removable memory 1060, power management integrated circuit (PMIC) 1065 and smart battery 1070.

In some aspects, application processor 1005 may include, for example, one or more CPU cores and one or more of cache memory, low drop-out voltage regulators (LDOs), e.g. the LDO introduced in connection with FIGS. 2 to 7b, interrupt controllers, serial interfaces such as serial peripheral interface (SPI), inter-integrated circuit (I$^2$C) or universal programmable serial interface module, real time clock (RTC), timer-counters including interval and watchdog timers, general purpose input-output (IO), memory card controllers such as secure digital/multi-media card (SD/MMC) or similar, universal serial bus (USB) interfaces, mobile industry processor interface (MIPI) interfaces and Joint Test Access Group (JTAG) test access ports.

In some aspects, baseband module 1010 may be implemented, for example, as a solder-down substrate including one or more integrated circuits, a single packaged integrated circuit soldered to a main circuit board, and/or a multi-chip module containing two or more integrated circuits.

Figure 11:
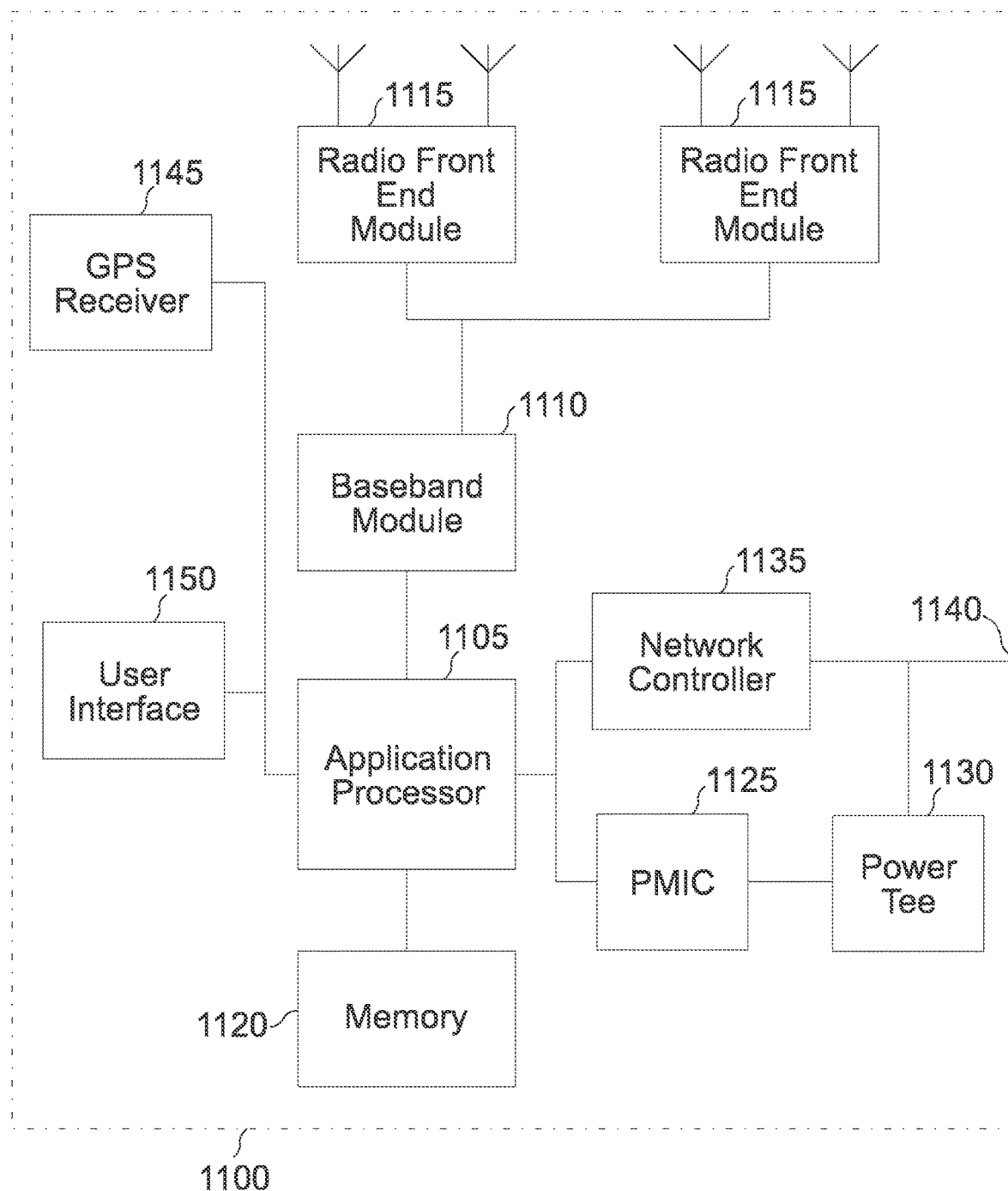
FIG. 11 illustrates a base station or infrastructure equipment radio head in accordance with an aspect.

FIG. 11 illustrates a base station or infrastructure equipment radio head 1100, e.g. the base station transceiver 930, in accordance with an aspect. The base station radio head 1100 may include one or more of application processor 1105, baseband modules 1110, one or more radio front end modules 1115, memory 1120, power management circuitry 1125, power tee circuitry 1130, network controller 1135, network interface connector 1140, satellite navigation receiver module 1145, and user interface 1150.

In some aspects, application processor 1105 may include one or more CPU cores and one or more of cache memory, low drop-out voltage regulators (LDOs), interrupt controllers, serial interfaces such as SPI, I²C or universal programmable serial interface module, real time clock (RTC), timer-counters including interval and watchdog timers, general purpose IO, memory card controllers such as SD/MMC or similar, USB interfaces, MIPI interfaces and Joint Test Access Group (JTAG) test access ports.

In some aspects, baseband processor 1110 may be implemented, for example, as a solder-down substrate including one or more integrated circuits, a single packaged integrated circuit soldered to a main circuit board or a multi-chip module containing two or more integrated circuits.

In some aspects, memory 1120 may include one or more of volatile memory including dynamic random access memory (DRAM) and/or synchronous dynamic random access memory (SDRAM), and nonvolatile memory (NVM) including high-speed electrically erasable memory (commonly referred to as Flash memory), phase change random access memory (PRAM), magnetoresistive random access memory (MRAM) and/or a three-dimensional crosspoint memory. Memory 1120 may be implemented as one or more of solder down packaged integrated circuits, socketed memory modules and plug-in memory cards.

In some aspects, power management integrated circuitry 1125 may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, power tee circuitry 1130 may provide for electrical power drawn from a network cable to provide both power supply and data connectivity to the base station radio head 1100 using a single cable.

In some aspects, network controller 1135 may provide connectivity to a network using a standard network interface protocol such as Ethernet. Network connectivity may be provided using a physical connection which is one of electrical (commonly referred to as copper interconnect), optical or wireless.

In some aspects, satellite navigation receiver module 1145 may include circuitry to receive and decode signals transmitted by one or more navigation satellite constellations such as the global positioning system (GPS), Globalnaya Navigatsionnaya Sputnikovaya Sistema (GLONASS), Galileo and/or BeiDou. The receiver 1145 may provide data to application processor 1105 which may include one or more of position data or time data. Application processor 1105 may use time data to synchronize operations with other radio base stations.

In some aspects, user interface 1150 may include one or more of physical or virtual buttons, such as a reset button, one or more indicators such as light emitting diodes (LEDs) and a display screen.

Figure 12A:
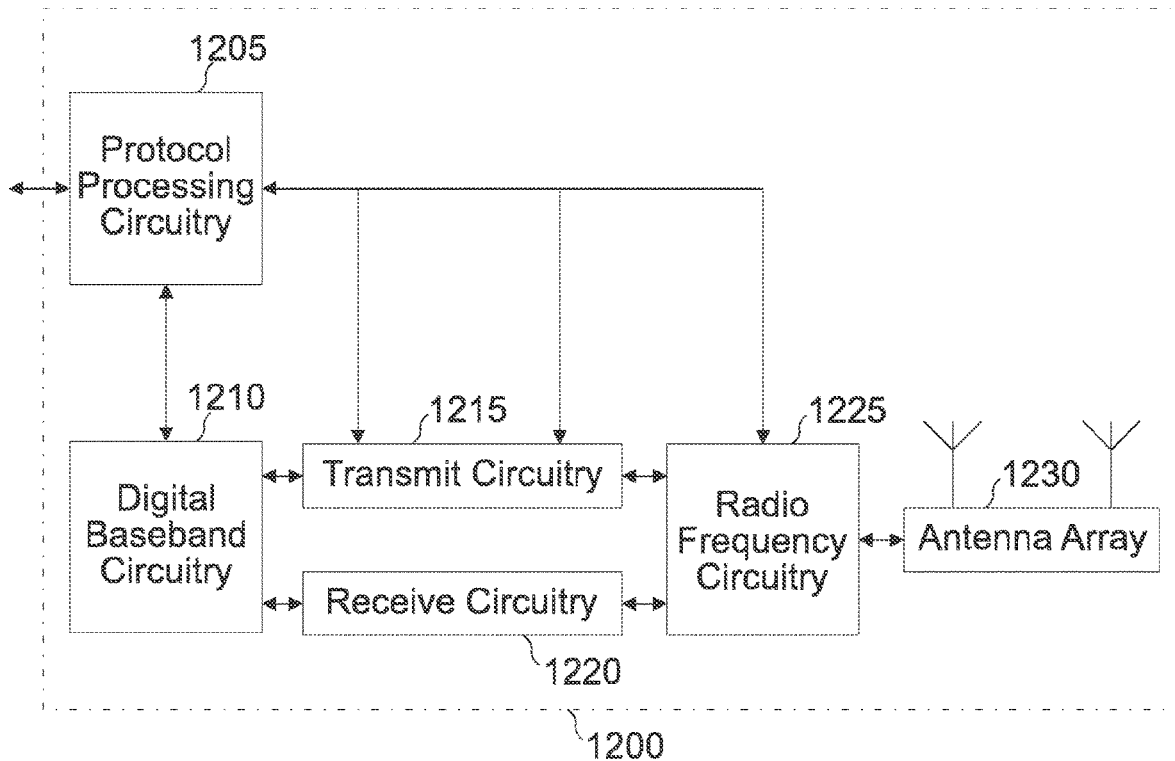
FIG. 12a illustrates an exemplary millimeter wave communication circuitry according to some aspects.

FIG. 12a illustrates an exemplary millimeter wave communication circuitry 1200 according to some aspects. Circuitry 1200 is alternatively grouped according to functions. Components as shown in 1200 are shown here for illustrative purposes and may include other components not shown here in FIG. 12a.

Millimeter wave communication circuitry 1200 may include protocol processing circuitry 1205, which may implement one or more of medium access control (MAC), radio link control (RLC), packet data convergence protocol (PDCP), radio resource control (RRC) and nonaccess stratum (NAS) functions. Protocol processing circuitry 1205 may include one or more processing cores (not shown) to execute instructions and one or more memory structures (not shown) to store program and data information.

Millimeter wave communication circuitry 1200 may further include digital baseband circuitry 1210, which may implement physical layer (PHY) functions including one or more of hybrid automatic repeat request (HARQ) functions, scrambling and/or descrambling, coding and/or decoding, layer mapping and/or de-mapping, modulation symbol mapping, received symbol and/or bit metric determination, multi-antenna port pre-coding and/or decoding which may include one or more of space-time, space-frequency or spatial coding, reference signal generation and/or detection, preamble sequence generation and/or decoding, synchronization sequence generation and/or detection, control channel signal blind decoding, and other related functions.

Millimeter wave communication circuitry 1200 may further include transmit circuitry 1215, receive circuitry 1220 and/or antenna array circuitry 1230.

Millimeter wave communication circuitry 1200 may further include radio frequency (RF) circuitry 1225. In an aspect of the invention, RF circuitry 1225 may include multiple parallel RF chains for one or more of transmit or receive functions, each connected to one or more antennas of the antenna array 1230.

In an aspect of the disclosure, protocol processing circuitry 1205 may include one or more instances of control circuitry (not shown) to provide control functions for one or more of digital baseband circuitry 1210, transmit circuitry 1215, receive circuitry 1220, and/or radio frequency circuitry 1225.

Figure 12B:
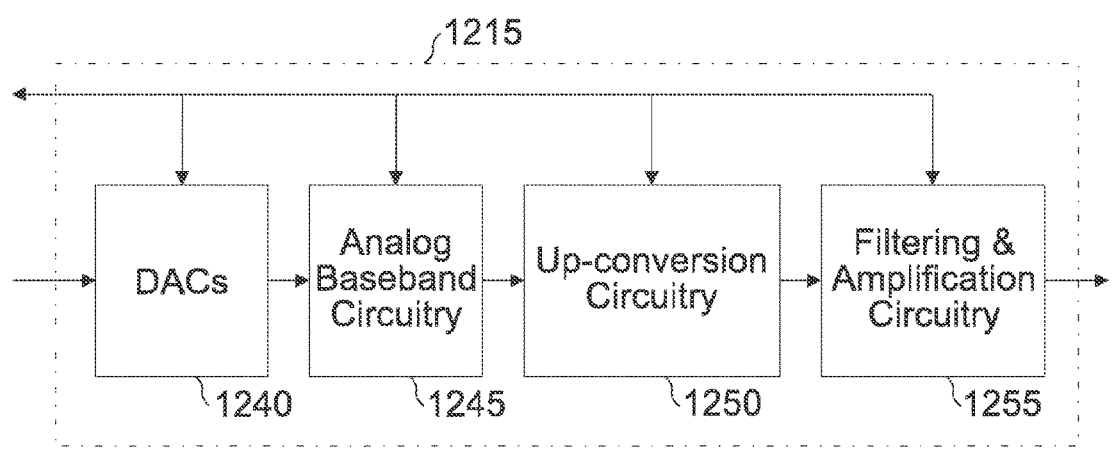
FIGS. 12b and 12c illustrate examples for transmit circuitry in FIG. 12a in some aspects.
Figure 12C:
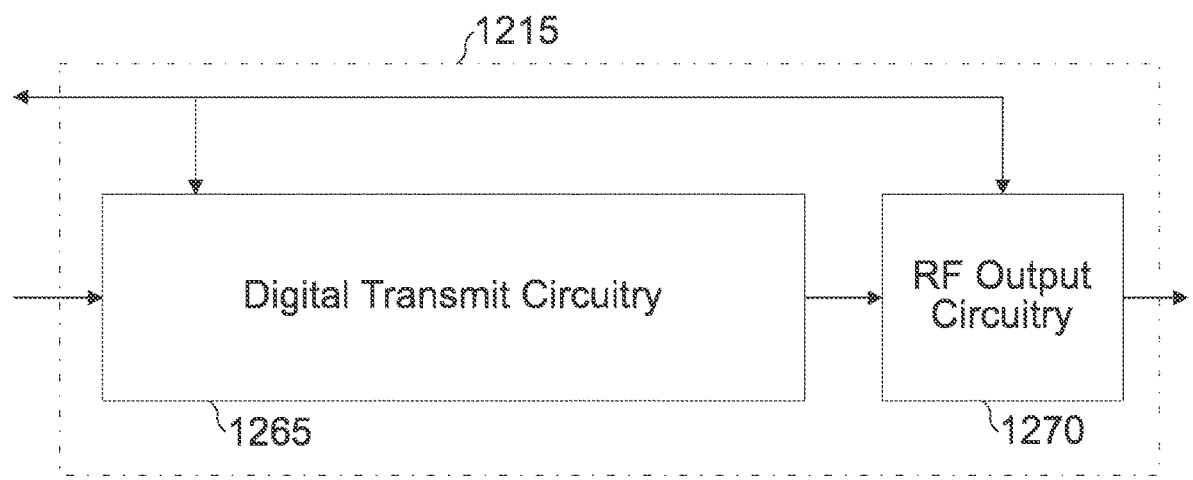

FIGS. 12b and 12c illustrate examples for transmit circuitry 1215 in FIG. 12a in some aspects.

The exemplary transmit circuitry 1215 of FIG. 12b may include one or more of digital to analog converters (DACs) 1240, analog baseband circuitry 1245, up-conversion circuitry 1250 and filtering and amplification circuitry 1255. In another aspect, 12c illustrates an exemplary transmit circuitry 1215 which includes digital transmit circuitry 1265 and output circuitry 1270.

Figure 12D:
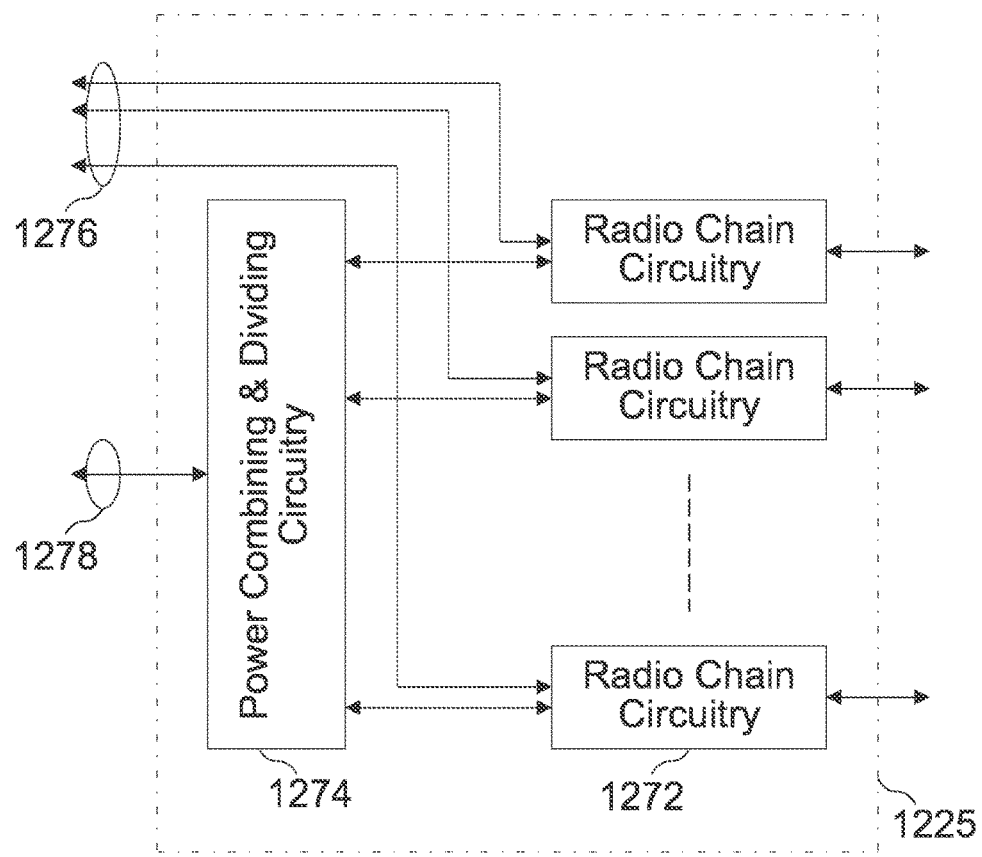
FIG. 12d illustrates an exemplary radio frequency circuitry in FIG. 12a according to some aspects.

FIG. 12d illustrates an exemplary radio frequency circuitry 1225 in FIG. 12a according to some aspects.

Radio frequency circuitry 1225 may include one or more instances of radio chain circuitry 1272, which in some aspects may include one or more filters, power amplifiers, low noise amplifiers, programmable phase shifters and power supplies (not shown).

Radio frequency circuitry 1225 may include power combining and dividing circuitry 1274 in some aspects. In some aspects, power combining and dividing circuitry 1274 may operate bidirectionally, such that the same physical circuitry may be configured to operate as a power divider when the device is transmitting, and as a power combiner when the device is receiving. In some aspects, power combining and dividing circuitry 1274 may one or more include wholly or partially separate circuitries to perform power dividing when the device is transmitting and power combining when the device is receiving. In some aspects, power combining and dividing circuitry 1274 may include passive circuitry comprising one or more two-way power divider/combiners arranged in a tree. In some aspects, power combining and dividing circuitry 1274 may include active circuitry comprising amplifier circuits.

In some aspects, radio frequency circuitry 1225 may connect to transmit circuitry 1215 and receive circuitry 1220 in FIG. 12*a* via one or more radio chain interfaces 1276 or a combined radio chain interface 1278.

In some aspects, one or more radio chain interfaces 1276 may provide one or more interfaces to one or more receive or transmit signals, each associated with a single antenna structure which may comprise one or more antennas.

In some aspects, the combined radio chain interface 1278 may provide a single interface to one or more receive or transmit signals, each associated with a group of antenna structures comprising one or more antennas.

Figure 12E:
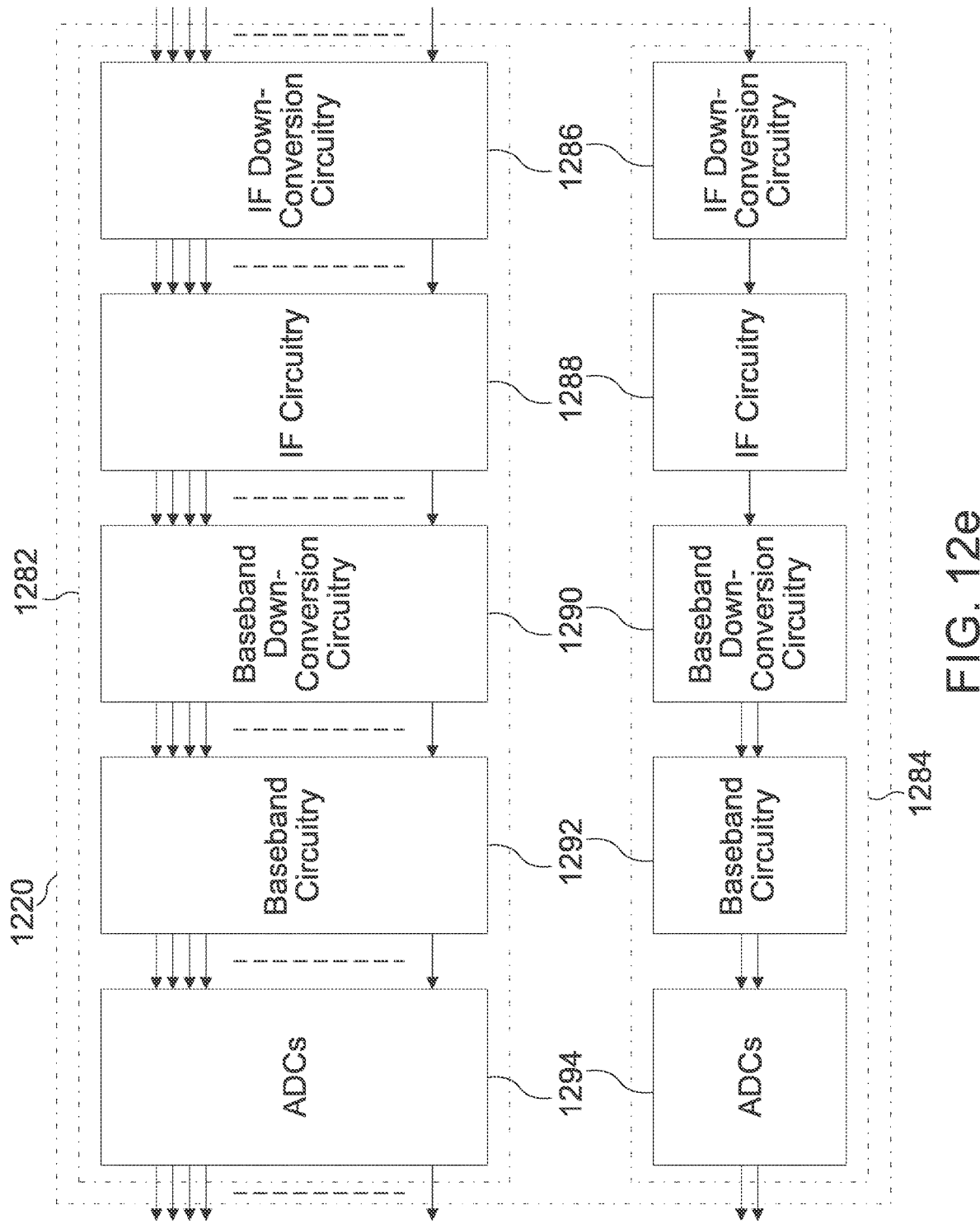
FIG. 12e illustrates exemplary receive circuitry in FIG. 12a according to some aspects.

FIG. 12*e* illustrates exemplary receive circuitry 1220 in FIG. 12*a* according to some aspects. Receive circuitry 1220 may include one or more of parallel receive circuitry 1282 and/or one or more of combined receive circuitry 1284.

In some aspects, the one or more parallel receive circuitry 1282 and one or more combined receive circuitry 1284 may include one or more Intermediate Frequency (IF) down-conversion circuitry 1286, IF processing circuitry 1288, baseband down-conversion circuitry 1290, baseband processing circuitry 1292 and analog-to-digital converter (ADC) circuitry 1294.

Figure 13:
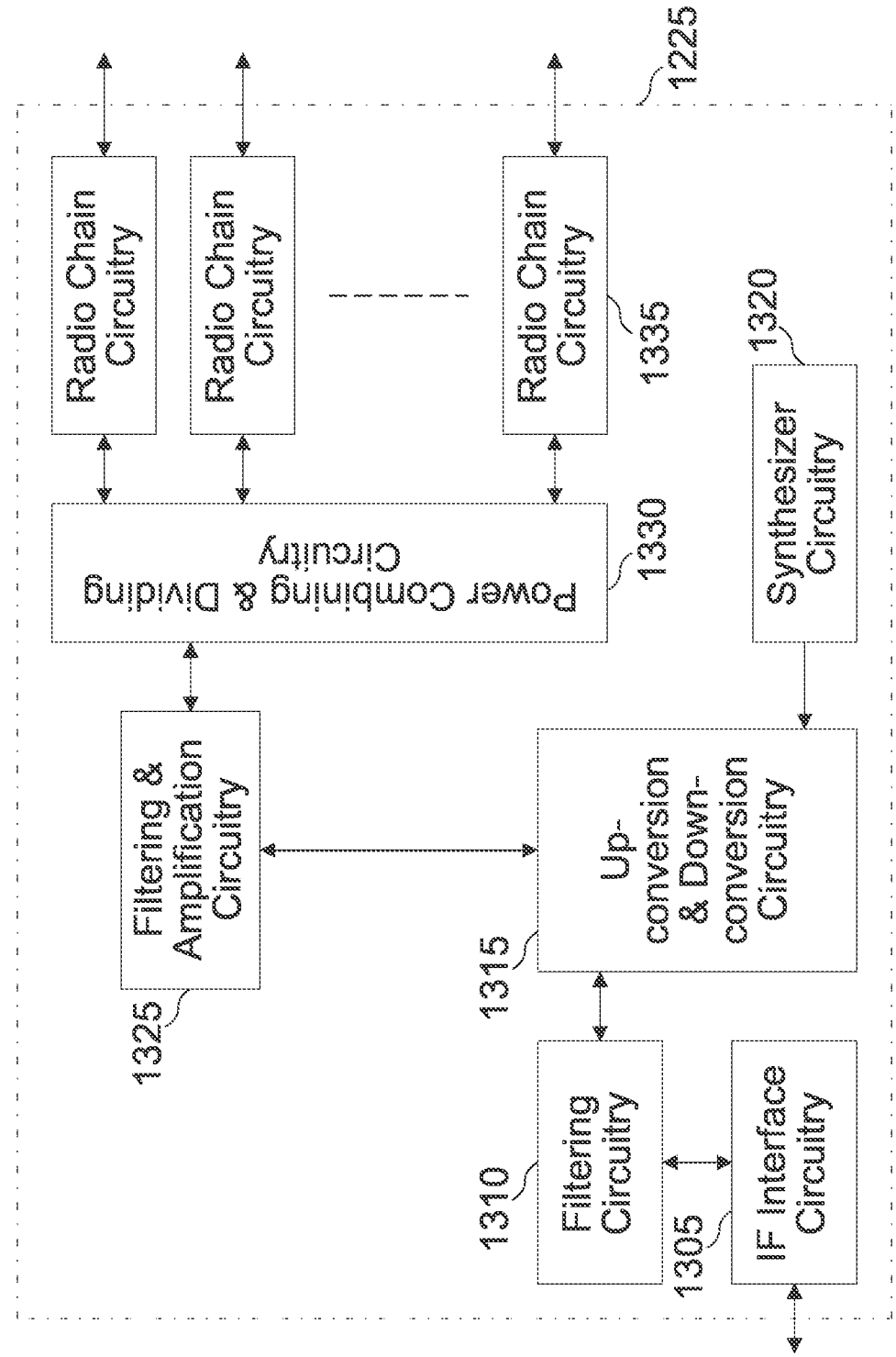
FIG. 13 illustrates RF circuitry according to some aspects.

FIG. 13 illustrates RF circuitry 1225 according to some aspects.

In an aspect, RF circuitry 1225 may include one or more of each of IF interface circuitry 1305, filtering circuitry 1310, upconversion and downconversion circuitry 1315, synthesizer circuitry 1320, filtering and amplification circuitry 1325, power combining and dividing circuitry 1330 and radio chain circuitry 1335.

The aspects and features mentioned and described together with one or more of the previously detailed examples and figures, may as well be combined with one or more of the other examples in order to replace a like feature of the other example or in order to additionally introduce the feature to the other example.

Example 1 relates to a buffered flipped voltage follower circuit arrangement, e.g. one of the buffered flipped voltage follower circuit arrangements 200; 300*a*; 300*b*; 300*c*; 500*a*; 500*b*; 500*c*; 500*d*: 500*g*; 500*h* of one of the FIGS. 2 to 5*h*. The buffered flipped voltage follower circuit arrangement includes a first transistor $M_P$ with a first terminal, a second terminal and a gate terminal. The buffered flipped voltage follower circuit arrangement includes a second transistor $M_C$ with a first terminal, a second terminal and a gate terminal. The buffered flipped voltage follower circuit arrangement includes a buffer circuit with an input terminal and an output terminal. The buffered flipped voltage follower circuit arrangement a feed-forward compensation circuit $-g_{mf}$ with an input terminal and an output terminal. The first terminal of the first transistor $M_P$ is coupled to a supply voltage of the flipped voltage follower circuit. The second terminal of the first transistor $M_P$ is coupled with the first terminal of the second transistor $M_C$ and with an output voltage terminal of the buffered flipped voltage follower circuit arrangement, The second terminal of the second transistor $M_C$ is coupled with the input terminal of the buffer circuit and with the output terminal of the feed-forward compensation circuit $-g_{mf}$. The gate terminal of the first transistor $M_P$ is coupled with the output terminal of the buffer circuit and with the input terminal of the feed-forward compensation circuit $-g_{mf}$.

In example 2, the subject matter of example 1 or any other example may further include, that the feed-forward compensation circuit $-g_{mf}$ is a transconductance circuit.

In example 3, the subject matter of one of the examples 1 or 2 or any other example may further include, that the feed-forward compensation circuit includes a coupling capacitor $C_C$.

In example 4, the subject matter of example 3 or any other example may further include, that the feed-forward compensation circuit is coupled with the gate terminal of the first transistor $M_P$ via the coupling capacitor $C_C$.

In example 5, the subject matter of example 4 or any other example may further include, that the feed-forward compensation circuit further includes a transistor $M_F$; $kM_C$ and a resistor $R_B$, wherein a gate terminal of the transistor $M_F$ is coupled with a first terminal of the coupling capacitor $C_C$ and a first terminal of the resistor $R_B$, wherein a second terminal of the resistor $R_B$ is coupled to a bias voltage of the buffered flipped voltage follower circuit arrangement, wherein a second terminal of the coupling capacitor $C_C$ is the input terminal of the feed-forward compensation circuit, and wherein a first terminal of the transistor $M_F$ is the output terminal of the feed-forward compensation circuit.

In example 6, the subject matter of example 5 or any other example may further include, that a second terminal of the transistor $M_F$ is coupled with a current source $I'_B$ of the buffered flipped voltage follower circuit arrangement.

In example 7, the subject matter of one of the examples 5 or 6 or any other example may further include, that the bias voltage of the buffered flipped voltage follower circuit arrangement coupled to the second terminal of the resistor is different from a bias voltage of the buffered flipped voltage follower circuit arrangement coupled to a gate terminal of the second transistor $M_C$.

In example 8, the subject matter of example 5 or any other example may further include, that a second terminal of the transistor $kM_C$ is coupled with the second terminal of the first transistor $M_P$ and the first terminal of the second transistor $M_C$.

In example 9, the subject matter of one of the examples 5 to 7 or any other example may further include, that the transistor $kM_C$ of the feed-forward compensation circuit $-g_{mf}$ shares a semiconductor structure with the second transistor $1-kM_C$.

In example 10, the subject matter of example 3 or any other example may further include, that the feed-forward compensation circuit is coupled with the second terminal of the second transistor $M_C$ via the coupling capacitor $C_C$.

In example 11, the subject matter of example 10 or any other example may further include, that the feed-forward compensation circuit includes a third transistor $M_F$ and a fifth transistor $M_D$, wherein the third and fifth transistors each include a first terminal, a second terminal and a gate terminal, wherein the first terminal of the third transistor $M_F$ is coupled to a supply voltage of the buffered flipped voltage follower circuit arrangement, wherein the gate terminal of the third transistor $M_F$ is the input terminal of the feed-forward compensation circuit $-g_{mf}$, wherein the second terminal of the third transistor $M_F$ is directly or indirectly coupled with the first terminal of the fifth transistor $M_D$, wherein the second terminal of the fifth transistor $M_D$ is coupled to a ground potential of the buffered flipped voltage follower circuit arrangement.

In example 12, the subject matter of example 11 or any other example may further include, that the buffered flipped voltage follower circuit arrangement includes a fourth transistor $M_G$, wherein the second terminal of the third transistor $M_F$ is coupled with the first terminal of the fifth transistor $M_D$ via the fourth transistor $M_G$, wherein the second terminal of the third transistor $M_F$ is coupled with a first terminal of the fourth transistor $M_G$, wherein a gate terminal of the fourth transistor $M_G$ is coupled to a bias voltage of the buffered flipped voltage follower circuit arrangement, wherein a second terminal of the fourth transistor $M_G$ is coupled with the first terminal of the fifth transistor $M_D$.

In example 13, the subject matter of one of the examples 11 or 12 or any other example may further include, that the coupling capacitor $C_C$ includes a first terminal and a second terminal, wherein the first terminal of the coupling capacitor $C_C$ is the output terminal of the feed-forward compensation circuit, and wherein the second terminal of the coupling capacitor $C_C$ is coupled with the second terminal of the third transistor $M_F$.

In example 14, the subject matter of one of the examples 11 to 13 or any other example may further include, that the coupling capacitor $C_C$ includes a first terminal and a second terminal, wherein the first terminal of the coupling capacitor $C_C$ is the output terminal of the feed-forward compensation circuit, and wherein the second terminal of the coupling capacitor $C_C$ is coupled with the first terminal of the fifth transistor $M_D$.

In example 15, the subject matter of one of the examples 11 to 14 or any other example may further include, that the third transistor $M_F$ shares a semiconductor structure with the first transistor $M_P$.

In example 16, the subject matter of one of the examples 1 to 15 or any other example may further include, that the buffer circuit includes a source follower circuit 510.

In example 17, the subject matter of one of the examples 1 to 15 or any other example may further include, that the buffer circuit includes a super source follower circuit 530.

In example 18, the subject matter of one of the examples 1 to 17 or any other example may further include, that the gate terminal of the second transistor $M_C$ is coupled to a bias voltage $V_B$ of the buffered flipped voltage follower circuit arrangement.

In example 19, the subject matter of one of the examples 1 to 18 or any other example may further include, that the second terminal of the second transistor $M_C$ is coupled to a biasing current source of the buffered flipped voltage follower circuit arrangement.

Example 20 relates to a dropout voltage regulator 100 including the buffered flipped voltage follower circuit arrangement 200; 300a; 300b; 300c; 500a; 500b; 500c; 500d: 500g; 500h according to one of the examples 1 to 19.

Example 21 relates to a low dropout voltage regulator 100 including a feed-forward compensation circuit $-g_{mf}$, wherein the feed-forward compensation circuit $-g_{mf}$ is suitable for at least partially compensating a phase shift within a control loop of the low dropout voltage regulator.

In example 22, the subject matter of example 21 or any other example may further include, that the low dropout voltage regulator includes a pass transistor $M_P$ and a common-gate amplifier transistor $M_C$, wherein a first terminal of the pass transistor is coupled to a supply voltage of the low dropout voltage regulator, wherein a second terminal of the pass transistor is coupled to a first terminal of the common-gate amplifier transistor $M_C$ and to an output voltage terminal of the low dropout voltage regulator, wherein the feed-forward compensation circuit $-g_{mf}$ is suitable for providing a feed forward compensation between a second terminal of the common-gate amplifier transistor $M_C$ and the output voltage terminal of the low dropout voltage regulator.

In example 23, the subject matter of example 21 or any other example may further include, that the low dropout voltage regulator includes a pass transistor $M_P$ and a common-gate amplifier transistor $M_C$, wherein a first terminal of the pass transistor is coupled to a supply voltage of the low dropout voltage regulator, wherein a second terminal of the pass transistor is coupled to a first terminal of the common-gate amplifier transistor $M_C$ and to an output voltage terminal of the low dropout voltage regulator, wherein the feed-forward compensation circuit $-g_{mf}$ is suitable for providing a feed forward compensation between a gate terminal of the pass transistor and a second terminal of the common-gate amplifier transistor $M_C$.

Example 24 relates to a capacitive digital-to-analog converter 900 including a low dropout voltage regulator 100 according to one of the examples 20 to 23 or according to any other example.

Example 25 relates to a transceiver 910 for wireless communication including the low dropout voltage regulator 100 according to one of the examples 20 to 23 or according to any other example.

Example 26 relates to mobile communication device 920 including the low dropout voltage regulator 100 according to one of the examples 20 to 23 or according to any other example.

Example 27 relates to a base station transceiver 930 including the low dropout voltage regulator 100 according to one of the examples 20 to 23 or according to any other example.

Example 28 relates to a method for forming a buffered flipped voltage follower circuit arrangement, e.g. the buffered flipped voltage follower circuit arrangement 200; 300a; 300b; 300c; 500a; 500b; 500c; 500d: 500g; 500h introduced in connection with one of the FIGS. 2 to 5h. The method includes forming 810 a first transistor $M_P$ including a first terminal, a second terminal and a gate terminal. The method includes forming 820 a second transistor $M_C$ including a first terminal, a second terminal and a gate terminal. The method includes forming 830 a buffer circuit including an input terminal and an output terminal. The method includes forming 840 a feed-forward compensation circuit $-g_{mf}$ including an input terminal and an output terminal. The method includes forming 850 interconnections between the first transistor $M_P$, the second transistor $M_C$, the buffer circuit and the feed-forward compensation circuit $-g_{mf}$. The first terminal of the first transistor $M_P$ is coupled to a supply voltage of the flipped voltage follower circuit. The second terminal of the first transistor $M_P$ is coupled with the first terminal of the second transistor $M_C$ and with an output voltage terminal of the buffered flipped voltage follower circuit arrangement. The second terminal of the second transistor $M_C$ is coupled with the input terminal of the buffer circuit and with the output terminal of the feed-forward compensation circuit $-g_{mf}$. The gate terminal of the first transistor $M_P$ is coupled with the output terminal of the buffer circuit and with the input terminal of the feed-forward compensation circuit $-g_{mf}$.

In example 29, the subject matter of example 28 or any other example may further include, that the feed-forward compensation circuit $-g_{mf}$ is a transconductance circuit.

In example 30, the subject matter of one of the examples 28 or 29 or any other example may further include, that the feed-forward compensation circuit includes a coupling capacitor $C_C$.

In example 31, the subject matter of example 30 or any other example may further include, that the feed-forward compensation circuit is coupled with the gate terminal of the first transistor $M_P$ via the coupling capacitor $C_C$.

In example 32, the subject matter of example 31 or any other example may further include, that the feed-forward compensation circuit further includes a transistor $M_F$ and a resistor $R_B$, wherein a gate terminal of the transistor $M_F$ is coupled with a first terminal of the coupling capacitor $C_C$ and a first terminal of the resistor $R_B$, wherein a second terminal of the resistor $R_B$ is coupled to a bias voltage of the buffered flipped voltage follower circuit arrangement, wherein a second terminal of the coupling capacitor $C_C$ is the input terminal of the feed-forward compensation circuit, and wherein a first terminal of the transistor $M_F$ is the output terminal of the feed-forward compensation circuit.

In example 33, the subject matter of example 32 or any other example may further include, that a second terminal of the transistor $M_F$ is coupled with a current source $I'_B$ of the buffered flipped voltage follower circuit arrangement.

In example 34, the subject matter of one of the examples 32 or 33 or any other example may further include, that the bias voltage of the buffered flipped voltage follower circuit arrangement coupled to the second terminal of the resistor is different from a bias voltage of the buffered flipped voltage follower circuit arrangement coupled to a gate terminal of the second transistor $M_C$.

In example 35, the subject matter of example 32 or any other example may further include, that a second terminal of the transistor $M_F$ is coupled with the second terminal of the first transistor $M_P$ and the first terminal of the second transistor $M_C$.

In example 36, the subject matter of one of the examples 32 to 35 or any other example may further include, that the transistor $M_F$ of the feed-forward compensation circuit $-g_{mf}$ shares a semiconductor structure with the second transistor $M_C$.

In example 37, the subject matter of example 30 or any other example may further include, that the feed-forward compensation circuit is coupled with the second terminal of the second transistor $M_C$ via the coupling capacitor $C_C$.

In example 38, the subject matter of example 37 or any other example may further include, that the feed-forward compensation circuit includes a third transistor $M_F$ and a fifth transistor $M_D$, wherein the third and fifth transistors each include a first terminal, a second terminal and a gate terminal, wherein the first terminal of the third transistor $M_F$ is coupled to a supply voltage of the buffered flipped voltage follower circuit arrangement, wherein the gate terminal of the third transistor $M_F$ is the input terminal of the feed-forward compensation circuit, wherein the second terminal of the third transistor $M_F$ is directly or indirectly coupled with the first terminal of the fifth transistor $M_D$, wherein the second terminal of the fifth transistor $M_D$ is coupled to a ground potential of the buffered flipped voltage follower circuit arrangement.

In example 39, the subject matter of example 38 or any other example may further include, that the feed-forward compensation circuit includes a fourth transistor $M_G$, wherein the second terminal of the third transistor $M_F$ is coupled with the first terminal of the fifth transistor $M_D$ via the fourth transistor $M_G$, wherein the second terminal of the third transistor $M_F$ is coupled with a first terminal of the fourth transistor $M_G$, wherein a gate terminal of the fourth transistor $M_G$ is coupled to a bias voltage of the buffered flipped voltage follower circuit arrangement, wherein a second terminal of the fourth transistor $M_G$ is coupled with the first terminal of the fifth transistor $M_D$.

In example 40, the subject matter of one of the examples example 38 or 39 or any other example may further include, that the coupling capacitor $C_C$ includes a first terminal and a second terminal, wherein the first terminal of the coupling capacitor $C_C$ is the output terminal of the feed-forward compensation circuit, and wherein the second terminal of the coupling capacitor $C_C$ is coupled with the second terminal of the third transistor $M_F$.

In example 41, the subject matter of one of the examples 38 to 40 or any other example may further include, that the coupling capacitor $C_C$ includes a first terminal and a second terminal, wherein the first terminal of the coupling capacitor $C_C$ is the output terminal of the feed-forward compensation circuit, and wherein the second terminal of the coupling capacitor $C_C$ is coupled with the first terminal of the fifth transistor $M_D$.

In example 42, the subject matter of one of the examples 38 to 41 or any other example may further include, that the third transistor $M_F$ shares a semiconductor structure with the first transistor $M_P$.

In example 43, the subject matter of one of the examples 28 to 42 or any other example may further include, that the buffer circuit includes a source follower circuit 510.

In example 44, the subject matter of one of the examples 28 to 42 or any other example may further include, that the buffer circuit includes a super source follower circuit 530.

In example 45, the subject matter of one of the examples 28 to 44 or any other example may further include, that the gate terminal of the second transistor $M_C$ is coupled to a bias voltage $V_B$ of the buffered flipped voltage follower circuit arrangement.

In example 46, the subject matter of one of the examples 28 to 45 or any other example may further include, that the second terminal of the second transistor $M_C$ is coupled to a biasing current source of the buffered flipped voltage follower circuit arrangement.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F) PGAs), programmed to perform the acts of the above-described methods.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a signal", "means for generating a signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A buffered flipped voltage follower circuit arrangement comprising:
   A first transistor ($M_P$) with a first terminal, a second terminal and a gate terminal;
   a second transistor ($M_c$) with a first terminal, a second terminal and a gate terminal;
   a buffer circuit with an input terminal and an output terminal; and
   a feed-forward compensation circuit ($-g_m f$) with an input terminal and an output terminal,
   wherein the first terminal of the first transistor ($M_P$) is coupled to a supply voltage of the flipped voltage follower circuit,
   wherein the second terminal of the first transistor ($M_P$) is coupled with the first terminal of the second transistor ($M_c$) and with an output voltage terminal of the buffered flipped voltage follower circuit arrangement,
   wherein the second terminal of the second transistor (Mc) is coupled with the input terminal of the buffer circuit and with the output terminal of the feed-forward compensation circuit ($-g_m f$), and
   wherein the gate terminal of the first transistor ($M_P$) is coupled with the output terminal of the buffer circuit and with the input terminal of the feed-forward compensation circuit ($-g_m f$).

2. The buffered flipped voltage follower circuit arrangement according to claim 1, wherein the feed-forward compensation circuit ($-g_m f$) is a transconductance circuit.

3. The buffered flipped voltage follower circuit arrangement according to claim 1, wherein the feed-forward compensation circuit comprises a coupling capacitor ($C_c$).

4. The buffered flipped voltage follower circuit arrangement according to claim 3, wherein the feed-forward compensation circuit is coupled with the gate terminal of the first transistor ($M_P$) via the coupling capacitor ($C_C$).

5. The buffered flipped voltage follower circuit arrangement according to claim 4, wherein the feed-forward compensation circuit further comprises a transistor ($M_F$;$kM_c$) and a resistor ($R_B$), wherein a gate terminal of the transistor ($M_F$) is coupled with a first terminal of the coupling capacitor ($C_C$) and a first terminal of the resistor ($R_B$), wherein a second terminal of the resistor ($R_B$), is coupled to a bias voltage of the buffered flipped voltage follower circuit arrangement, wherein a second terminal of the coupling capacitor ($C_C$) is the input terminal of the feed-forward compensation circuit, and wherein a first terminal of the transistor ($M_F$) is the output terminal of the feed-forward compensation circuit.

6. The buffered flipped voltage follower circuit arrangement according to claim 5, wherein a second terminal of the transistor ($M_F$) is coupled with a current source $I_B$ of the buffered flipped voltage follower circuit arrangement.

7. The buffered flipped voltage follower circuit arrangement according to claim 5, wherein the bias voltage of the buffered flipped voltage follower circuit arrangement coupled to the second terminal of the resistor is different from a bias voltage of the buffered flipped voltage follower circuit arrangement coupled to a gate terminal of the second transistor ($M_c$).

8. The buffered flipped voltage follower circuit arrangement according to claim 5, wherein a second terminal of the transistor ($kM_c$) is coupled with the second terminal of the first transistor ($M_P$) and the first terminal of the second transistor ($M_c$).

9. The buffered flipped voltage follower circuit arrangement according to claim 5, wherein the transistor ($kM_c$) of the feed-forward compensation circuit (-$g_m$f) shares a semiconductor structure with the second transistor ((1-k)$M_c$).

10. The buffered flipped voltage follower circuit arrangement according to claim 3, wherein the feed-forward compensation circuit is coupled with the second terminal of the second transistor ($M_c$) via the coupling capacitor ($C_C$).

11. The buffered flipped voltage follower circuit arrangement according to claim 10, wherein the feed-forward compensation circuit comprises a third transistor ($M_F$) and a fifth transistor ($M_D$), wherein the third and fifth transistors each comprise a first terminal, a second terminal and a gate terminal, where in the first terminal of the third transistor ($M_F$) is coupled to a supply voltage of the buffered flipped voltage follower circuit arrangement, wherein the gate terminal of the third transistor ($M_F$) is the input terminal of the feed-forward compensation circuit (-$g_m$f) wherein the second terminal of the third transistor ($M_F$) is directly or indirectly coupled with the first terminal of the fifth transistor ($M_D$), wherein the second terminal of the fifth transistor ($M_D$), is coupled to a ground potential of the buffered flipped voltage follower circuit arrangement.

12. The buffered flipped voltage follower circuit arrangement according to claim 11, wherein the buffered flipped voltage follower circuit arrangement comprises a fourth transistor ($M_G$), wherein the second terminal of the third transistor ($M_F$) is coupled with the first terminal of the fifth transistor ($M_D$) via the fourth transistor ($M_G$), wherein the second terminal of the third transistor ($M_F$) is coupled with a first terminal of the fourth transistor ($M_G$), wherein a gate terminal of the fourth transistor ($M_g$) is coupled to a bias voltage of the buffered flipped voltage follower circuit arrangement, wherein a second terminal of the fourth transistor ($M_G$) is coupled with the first terminal of the fifth transistor ($M_D$).

13. The buffered flipped voltage follower circuit arrangement according to claim 11, wherein the coupling capacitor ($C_c$) comprises a first terminal and a second terminal, wherein the first terminal of the coupling capacitor ($C_c$) is the output terminal of the feed-forward compensation circuit, and wherein the second terminal of the coupling capacitor ($C_c$) is coupled with the second terminal of the third transistor ($M_F$).

14. The buffered flipped voltage follower circuit arrangement according to claim 11, wherein the coupling capacitor ($C_c$) comprises a first terminal and a second terminal, wherein the first terminal of the coupling capacitor ($C_c$) is the output terminal of the feed-forward compensation circuit, and wherein the second terminal of the coupling capacitor ($C_c$) is coupled with the first terminal of the fifth transistor ($M_D$).

15. The buffered flipped voltage follower circuit arrangement according to claim 11, wherein the third transistor ($M_F$) shares a semiconductor structure with the first transistor ($M_P$).

16. The buffered flipped voltage follower circuit arrangement according to claim 1, wherein the buffer circuit comprises a source follower circuit.

17. The buffered flipped voltage follower circuit arrangement according to claim 1, wherein the buffer circuit comprises a super source follower circuit.

18. The buffered flipped voltage follower circuit arrangement according to claim 1, wherein the gate terminal of the second transistor ($M_c$) is coupled to a bias voltage ($V_B$) of the buffered flipped voltage follower circuit arrangement.

19. The buffered flipped voltage follower circuit arrangement according to claim 1, wherein the second terminal of the second transistor ($M_c$) is coupled to a biasing current source of the buffered flipped voltage follower circuit arrangement.

20. A low drop out voltage regulator comprising the buffered flipped voltage follower circuit arrangement according to claim 1.

21. A capacitive digital-to-analog converter comprising a low dropout voltage regulator according to claim 20.

22. Method for forming a buffered flipped voltage follower circuit arrangement, the method comprising:
forming a first transistor ($M_P$) comprising a first terminal, a second terminal and a gate terminal;
forming a second transistor ($M_c$) comprising a first terminal, a second terminal and a gate terminal;
forming a buffer circuit comprising an input terminal and an output terminal;
forming a feed-forward compensation circuit (-$g_m$f) comprising an input terminal and an output terminal; and
forming interconnections between the first transistor ($M_P$), the second transistor ($M_C$), the buffer circuit and the feed-forward compensation circuit (-$g_m$f),
wherein the first terminal of the first transistor ($M_P$) is coupled to a supply voltage of the flipped voltage follower circuit,
wherein the second terminal of the first transistor ($M_P$) is coupled with the first terminal of the second transistor ($M_C$) and with an output voltage terminal of the buffered flipped voltage follower circuit arrangement,
wherein the second terminal of the second transistor ($M_c$) is coupled with the input terminal of the buffer circuit and with the output terminal of the feed-forward compensation circuit (-$g_{mf}$), and
wherein the gate terminal of the first transistor ($M_P$) is coupled with the output terminal of the buffer circuit and with the input terminal of the feed-forward compensation circuit (-$g_m$f).

* * * * *